US00RE47600E

(19) United States
(12) Reissued Patent
Pendse

(10) Patent Number: US RE47,600 E
(45) Date of Reissued Patent: *Sep. 10, 2019

(54) SEMICONDUCTOR DEVICE AND METHOD OF FORMING ELECTRICAL INTERCONNECT WITH STRESS RELIEF VOID

(71) Applicant: STATS ChipPAC, Ltd., Singapore (SG)

(72) Inventor: Rajendra D. Pendse, Fremont, CA (US)

(73) Assignee: STATS ChipPAC Pte. Ltd., Singapore (SG)

( * ) Notice: This patent is subject to a terminal disclaimer.

(21) Appl. No.: 14/332,155

(22) Filed: Jul. 15, 2014

Related U.S. Patent Documents

Reissue of:
(64) Patent No.: 8,350,384
Issued: Jan. 8, 2013
Appl. No.: 12/963,934
Filed: Dec. 9, 2010

U.S. Applications:
(60) Continuation-in-part of application No. 12/624,482, filed on Nov. 24, 2009, now Pat. No. 8,129,841,
(Continued)

(51) Int. Cl.
*H01L 23/00* (2006.01)

(52) U.S. Cl.
CPC ..... *H01L 24/11* (2013.01); *H01L 2224/16* (2013.01); *H01L 2924/0133* (2013.01)

(58) Field of Classification Search
CPC ..... H01L 2924/14; H01L 2924/01029; H01L 2924/01079; H01L 2924/01013;
(Continued)

(56) References Cited

U.S. PATENT DOCUMENTS 5,186,383 A * 2/1993 Melton ..... B23K 1/0016 228/180.22
5,340,435 A 8/1994 Ito et al.
(Continued)

FOREIGN PATENT DOCUMENTS

JP 04-355933 9/1992
JP 2005-28037 4/1993
(Continued)

OTHER PUBLICATIONS

Heinen, K. Gail et al., "Multichip Assembly with Flipped Integrated Circuits", IEEE Transactions on Components, Hybrids, and Manufactureing Technology, vol. 12 No. 4, 1989, pp. 650-657.
(Continued)

*Primary Examiner* — Henry N Tran
(74) *Attorney, Agent, or Firm* — Robert D. Atkins; Patent Law Group: Atkins and Associates, P.C.

(57) ABSTRACT

A semiconductor device has a semiconductor die with a plurality of tapered bumps formed over a surface of the semiconductor die. The tapered bumps can have a non-collapsible portion and collapsible portion. A plurality of conductive traces is formed over a substrate with interconnect sites. A masking layer is formed over the substrate with openings over the conductive traces. The tapered bumps are bonded to the interconnect sites so that the tapered bumps contact the mask layer and conductive traces to form a void within the opening of the mask layer over the substrate. The substrate can be non-wettable to aid with forming the void in the opening of the masking layer. The void provides thermally induced stress relief. Alternatively, the masking
(Continued)

layer is sufficiently thin to avoid the tapered interconnect structures contacting the mask layer. An encapsulant or underfill material is deposited between the semiconductor die and substrate.

28 Claims, 22 Drawing Sheets

Related U.S. Application Data which is a continuation of application No. 11/640,468, filed on Dec. 14, 2006, now abandoned, which is a continuation-in-part of application No. 11/388,755, filed on Mar. 24, 2006, now abandoned, which is a continuation-in-part of application No. 10/985,654, filed on Nov. 10, 2004, now Pat. No. 7,368,817, and a continuation-in-part of application No. 12/643,180, filed on Dec. 21, 2009, now Pat. No. 8,216,930, which is a division of application No. 11/640,534, filed on Dec. 14, 2006, now Pat. No. 7,659,633, which is a continuation-in-part of application No. 11/388,755, filed on Mar. 24, 2006, and a continuation-in-part of application No. 10/985,654, filed on Nov. 10, 2004, now Pat. No. 7,368,817.

(60) Provisional application No. 60/597,648, filed on Dec. 14, 2005, provisional application No. 60/665,208, filed on Mar. 25, 2005, provisional application No. 60/518,864, filed on Nov. 10, 2003, provisional application No. 60/533,918, filed on Dec. 31, 2003.

(58) Field of Classification Search
CPC ..... H01L 2924/13099; H01L 2224/16; H01L 2224/13099; H01L 21/563; H01L 23/49838; H01L 24/11; H01L 24/12; H01L 24/16; H01L 24/32; H01L 24/0133; H01L 24/29109
USPC ..... 257/734, 737, 778, 781, E23.021; 438/612, 613
See application file for complete search history.

(56) References Cited

U.S. PATENT DOCUMENTS 5,378,859 A 1/1995 Shirasaki et al.
5,383,916 A 1/1995 Brown
5,386,624 A 2/1995 George et al.
5,434,410 A 7/1995 Kulwicki
5,473,197 A * 12/1995 Idaka ..... H01L 21/31058 257/737
5,508,561 A 4/1996 Tago et al.
5,519,580 A 5/1996 Natarajan et al.
5,587,337 A 12/1996 Idaka et al.
5,650,595 A 7/1997 Bentlage et al.
5,710,071 A 1/1998 Beddingfield et al.
5,795,818 A 8/1998 Marrs
5,798,285 A 8/1998 Bentlage et al.
5,844,782 A 12/1998 Fukasawa
5,854,514 A 12/1998 Roldan et al.
5,869,886 A 2/1999 Tokuno
5,872,399 A 2/1999 Lee
5,889,326 A 3/1999 Tanaka ..... H01L 24/11 257/737
5,915,169 A 6/1999 Heo
5,985,456 A 11/1999 Zhou et al.
6,002,172 A 12/1999 Desai et al.
6,049,122 A 4/2000 Yoneda
6,109,507 A 8/2000 Yagi et al.
6,149,122 A 11/2000 Berger et al.
6,201,305 B1 3/2001 Darveaux et al.
6,218,630 B1 4/2001 Takigami
6,228,466 B1 5/2001 Tsukada et al.
6,229,209 B1 5/2001 Nakamura et al.
6,229,220 B1 5/2001 Saitoh et al.
6,229,711 B1 5/2001 Yoneda
6,251,704 B1 6/2001 Ohuchi et al.
6,259,159 B1 7/2001 Dalal et al.
6,259,163 B1 7/2001 Ohuchi et al.
6,268,568 B1 * 7/2001 Kim ..... H01L 23/49816 174/250
6,278,184 B1 8/2001 Brofman et al.
6,281,107 B1 8/2001 Moriyama
6,281,450 B1 8/2001 Urasaki et al.
6,281,581 B1 8/2001 Desai et al.
6,297,560 B1 10/2001 Capote et al.
6,297,564 B1 10/2001 Chung
6,324,754 B1 12/2001 DiStefano et al.
6,329,605 B1 12/2001 Beroz et al.
6,333,206 B1 12/2001 Ito et al.
6,335,222 B1 1/2002 DiStefano
6,335,568 B1 1/2002 Yuzawa et al.
6,335,571 B1 1/2002 Capote et al.
6,383,916 B1 5/2002 Lin
6,396,707 B1 5/2002 Huang et al.
6,409,073 B1 6/2002 Kaskoun et al.
6,441,316 B1 8/2002 Kusui
6,448,665 B1 9/2002 Nakazawa et al.
6,458,622 B1 10/2002 Keser et al.
6,459,622 B1 10/2002 Ogura et al.
6,462,425 B1 10/2002 Iwasaki et al.
6,472,608 B2 10/2002 Nakayama
6,495,397 B2 12/2002 Kubota et al.
6,510,976 B2 1/2003 Hwee et al.
6,518,674 B2 2/2003 Interrante et al.
6,518,678 B2 2/2003 James et al.
6,550,666 B2 4/2003 Chew et al.
6,556,268 B1 4/2003 Lee et al.
6,563,712 B2 * 5/2003 Akram et al. ..... 361/719
6,573,610 B1 6/2003 Tsai
6,578,754 B1 6/2003 Tung
6,592,019 B2 7/2003 Tung
6,600,234 B2 7/2003 Kuwabara et al.
6,608,388 B2 8/2003 Lin et al.
6,612,024 B1 * 9/2003 Sasaki ..... H01L 21/563 174/260
6,660,560 B2 12/2003 Chaudhuri et al.
6,661,084 B1 12/2003 Peterson et al.
6,664,483 B2 12/2003 Chong et al.
6,678,948 B1 1/2004 Benzler et al.
6,681,982 B2 1/2004 Tung
6,696,644 B1 * 2/2004 Chiu ..... H01L 21/563 174/535
6,710,458 B2 3/2004 Seko
6,734,557 B2 5/2004 Taniguchi et al.
6,768,190 B2 7/2004 Yang et al.
6,774,474 B1 8/2004 Caletka et al. ..... H01L 23/3128 174/260
6,774,497 B1 8/2004 Qi et al.
6,780,673 B2 8/2004 Venkateswaran
6,780,682 B2 8/2004 Pendse
6,787,918 B1 9/2004 Tsai et al.
6,798,072 B2 9/2004 Kajiwara et al.
6,809,262 B1 10/2004 Hsu
6,818,545 B2 11/2004 Lee et al.
6,821,878 B2 11/2004 Danvir et al.
6,849,944 B2 2/2005 Murtuza et al.
6,870,276 B1 3/2005 Moxham et al.
6,888,255 B2 5/2005 Murtuza et al.
6,913,948 B2 7/2005 Caletka et al.
6,927,489 B1 8/2005 Yaguchi et al.
6,943,058 B2 9/2005 Chaudhuri et al.
7,005,585 B2 2/2006 Ishizaki
7,005,743 B2 2/2006 Iwatsu et al.
7,005,750 B2 2/2006 Liu
7,019,407 B2 * 3/2006 Chen ..... H01L 23/49816 257/737
7,049,705 B2 5/2006 Huang
7,057,284 B2 6/2006 Chauhan et al.
7,064,435 B2 6/2006 Chung et al.

(56) References Cited

U.S. PATENT DOCUMENTS

| | | | | |
|---|---|---|---|---|
| 7,078,819 | B2 | 7/2006 | DiStefano | |
| 7,084,511 | B2 * | 8/2006 | Matsuda | H01L 24/49 257/100 |
| 7,098,407 | B2 | 8/2006 | Kim et al. | |
| 7,101,781 | B2 | 9/2006 | Ho et al. | |
| 7,102,222 | B2 | 9/2006 | Kuo et al. | |
| 7,102,239 | B2 | 9/2006 | Pu et al. | |
| 7,112,524 | B2 | 9/2006 | Hsu et al. | |
| 7,164,208 | B2 | 1/2007 | Kainou et al. | |
| 7,173,828 | B2 | 2/2007 | Lin et al. | |
| 7,180,005 | B2 * | 2/2007 | Urano | H01L 23/49816 174/255 |
| 7,183,493 | B2 * | 2/2007 | Garcia et al. | 174/257 |
| 7,224,073 | B2 | 5/2007 | Kim | |
| 7,242,099 | B2 | 7/2007 | Lin et al. | |
| 7,271,484 | B2 | 9/2007 | Reiss et al. | |
| 7,294,451 | B2 | 11/2007 | Chiu et al. | |
| 7,294,457 | B2 | 11/2007 | Kukolj et al. | |
| 7,294,929 | B2 | 11/2007 | Miyazaki | |
| 7,317,245 | B1 | 1/2008 | Lee et al. | |
| 7,361,990 | B2 | 4/2008 | Lu et al. | |
| 7,405,484 | B2 | 7/2008 | Usui et al. | |
| 7,436,063 | B2 | 10/2008 | Miyata et al. | |
| 7,462,942 | B2 | 12/2008 | Tan et al. | |
| 7,488,896 | B2 | 2/2009 | Saiki et al. | |
| 7,521,284 | B2 | 4/2009 | Miranda et al. | |
| 7,642,660 | B2 | 1/2010 | Tay et al. | |
| 7,663,248 | B2 * | 2/2010 | Hedler et al. | 257/778 |
| 7,663,250 | B2 | 2/2010 | Jeon et al. | |
| 7,670,939 | B2 | 3/2010 | Topacio et al. | |
| 7,671,454 | B2 | 3/2010 | Seko | |
| 7,692,314 | B2 | 4/2010 | Yang et al. | |
| 7,700,407 | B2 | 4/2010 | Pendse | |
| 7,732,913 | B2 | 6/2010 | Hsieh et al. | |
| 7,750,457 | B2 | 7/2010 | Seko | |
| 7,790,509 | B2 | 9/2010 | Gerber | |
| 7,791,211 | B2 | 9/2010 | Chen et al. | |
| 7,847,399 | B2 | 12/2010 | Masumoto | |
| 7,847,417 | B2 | 12/2010 | Araki et al. | |
| 7,851,928 | B2 | 12/2010 | Gallegos et al. | |
| 7,898,083 | B2 | 3/2011 | Castro | |
| 7,902,660 | B1 | 3/2011 | Lee et al. | |
| 7,902,678 | B2 | 3/2011 | Ohuchi et al. | |
| 7,902,679 | B2 | 3/2011 | Lin et al. | |
| 7,932,170 | B1 | 4/2011 | Huemoeller et al. | |
| 7,947,602 | B2 | 5/2011 | Ito et al. | |
| 7,973,406 | B2 | 7/2011 | Pendse | |
| 8,026,128 | B2 | 9/2011 | Pendse | |
| 8,129,841 | B2 | 3/2012 | Pendse et al. | |
| 8,178,392 | B2 | 5/2012 | Choi et al. | |
| 8,318,537 | B2 | 11/2012 | Pendse | |
| 8,574,959 | B2 * | 11/2013 | Pendse | H01L 21/563 257/734 |
| 2001/0008309 | A1 | 7/2001 | Iijima et al. | |
| 2001/0013423 | A1 | 8/2001 | Dalal et al. | |
| 2001/0018230 | A1 | 8/2001 | Jimarez et al. | |
| 2002/0033412 | A1 | 3/2002 | Tung | |
| 2002/0041036 | A1 | 4/2002 | Smith | |
| 2002/0070451 | A1 | 6/2002 | Burnette et al. | |
| 2002/0100610 | A1 | 8/2002 | Yasuda et al. | |
| 2002/0121706 | A1 | 9/2002 | Tatsuta et al. | |
| 2002/0155637 | A1 | 10/2002 | Lee | |
| 2002/0179689 | A1 | 12/2002 | Tung | |
| 2002/0192865 | A1 | 12/2002 | Imasu et al. | |
| 2003/0049411 | A1 | 3/2003 | Chaudhuri et al. | |
| 2003/0057551 | A1 | 3/2003 | Datta et al. | |
| 2003/0067084 | A1 | 4/2003 | Shintani | |
| 2003/0116866 | A1 | 6/2003 | Cher 'Khng et al. | |
| 2003/0127734 | A1 | 7/2003 | Lee et al. | |
| 2003/0127747 | A1 | 7/2003 | Kajiwara et al. | |
| 2003/0157792 | A1 | 8/2003 | Tong et al. | |
| 2003/0168748 | A1 | 9/2003 | Katagiri et al. | |
| 2003/0175146 | A1 | 9/2003 | Yeh et al. | |
| 2003/0218249 | A1 | 11/2003 | Ho et al. | |
| 2004/0026107 | A1 | 2/2004 | Caldwell et al. | |
| 2004/0027788 | A1 | 2/2004 | Chiu et al. | |
| 2004/0035909 | A1 | 2/2004 | Yeh et al. | |
| 2004/0046263 | A1 | 3/2004 | Harper et al. | |
| 2004/0046264 | A1 | 3/2004 | Ho et al. | |
| 2004/0056341 | A1 | 3/2004 | Endo et al. | |
| 2004/0105223 | A1 | 6/2004 | Okada et al. | |
| 2004/0108135 | A1 | 6/2004 | Ashida | |
| 2004/0126927 | A1 | 7/2004 | Lin et al. | |
| 2004/0210122 | A1 | 10/2004 | Sieburg | |
| 2004/0232560 | A1 | 11/2004 | Su | |
| 2004/0232562 | A1 | 11/2004 | Hortaleza et al. | |
| 2005/0046041 | A1 | 3/2005 | Tsai | |
| 2005/0082654 | A1 | 4/2005 | Humpston et al. | |
| 2005/0103516 | A1 | 5/2005 | Kaneyuki | |
| 2005/0224991 | A1 | 10/2005 | Yeo | |
| 2005/0248037 | A1 | 11/2005 | Hung et al. | |
| 2006/0131758 | A1 | 6/2006 | Dao | |
| 2006/0192294 | A1 | 8/2006 | Lee | |
| 2006/0202331 | A1 | 9/2006 | Hu | |
| 2006/0216860 | A1 | 9/2006 | Pendse | |
| 2006/0255473 | A1 | 11/2006 | Pendse | |
| 2007/0200234 | A1 | 8/2007 | Gerber et al. | |
| 2007/0259514 | A1 | 11/2007 | Otremba | |
| 2008/0088013 | A1 | 4/2008 | Chew et al. | |
| 2008/0093749 | A1 | 4/2008 | Gerber et al. | |
| 2008/0179740 | A1 | 7/2008 | Liao | |
| 2008/0213941 | A1 | 9/2008 | Pendse | |
| 2008/0277802 | A1 | 11/2008 | Tsai et al. | |
| 2009/0045507 | A1 | 2/2009 | Pendse et al. | |
| 2009/0057378 | A1 | 3/2009 | Hwang et al. | |
| 2009/0108445 | A1 | 4/2009 | Liang | |
| 2009/0114436 | A1 | 5/2009 | Chen et al. | |
| 2009/0146303 | A1 | 6/2009 | Kwon | |
| 2009/0152716 | A1 | 6/2009 | Sohara | |
| 2009/0191329 | A1 | 7/2009 | Wang | |
| 2009/0288866 | A1 | 11/2009 | Tsai et al. | |
| 2009/0308647 | A1 | 12/2009 | Liao | |
| 2010/0139965 | A1 | 6/2010 | Wang et al. | |
| 2011/0049703 | A1 | 3/2011 | Hsu et al. | |
| 2013/0214409 | A1 | 8/2013 | Pagaila et al. | |
| 2013/0277830 | A1 | 10/2013 | Yu et al. | |

FOREIGN PATENT DOCUMENTS

| | | |
|---|---|---|
| JP | 6503687 | 4/1994 |
| JP | 09-097791 | 8/1997 |
| JP | 10-256307 | 9/1998 |
| JP | 10-256315 | 9/1998 |
| JP | 11145176 | 5/1999 |
| JP | 11233571 | 8/1999 |
| JP | 11330162 | 11/1999 |
| JP | 2000-031204 | 1/2000 |
| JP | 2000-133667 | 12/2000 |
| JP | 2000-349194 | 12/2000 |
| JP | 2001156203 | 6/2001 |
| JP | 2001-332583 | 11/2001 |
| JP | 2001351945 | 12/2001 |
| JP | 2002270732 | 9/2002 |
| JP | 2004-221205 | 5/2004 |
| JP | 2004165283 | 6/2004 |
| JP | 2005109187 | 4/2005 |
| JP | 2005333166 | 12/2005 |
| KR | 199879438 | 10/1997 |
| KR | 1998-79438 | 11/1998 |
| KR | 200062333 | 6/1999 |
| KR | 2000-62333 | 10/2000 |
| SG | 100817 | 7/2004 |
| TW | 530398 B | 5/2003 |
| WO | 9306964 | 4/1993 |
| WO | 0013228 | 3/2000 |
| WO | 03071842 | 8/2001 |

OTHER PUBLICATIONS

Lau, John H. et al., "A New Thermal-Fatigue Life Prediction Model For Wafer Level Chip Scale Package (WLCSP) Solder Joints", Journal of Electronic Packaging, vol. 124, 2002, pp. 212-220.

(56) References Cited

OTHER PUBLICATIONS

Love, David et al., "Wire Interconnect Technology, A New High-Reliability Tight-Pitch Interconnect Technology", Karl Suss, 1999.
Powell, D. O. et al., "Flip-Chip on FR-4 Integrated Circuit Packaging", HBN Technology Products, 1993, pp. 182-186.
Schubert, A. et al.. "Numerical and Experimental Investigations of Large IC Flip Chip Attach", Electronic Components and Technology Conference, 2000, pp. 1338-1346.
Yamada, Hiroshi et al., "Advanced copper column based solder bump for flip-chip interconnection", International Symposium on Microelectronics, 1997, pp. 417-422, The British Library—"The world's knowledge".
Yamada, Hiroshi et al., "A fine pitch and high aspect ratio bump array for flip-chip interconnection", Int'l Electronics Manufacturing Technology Symposium, 1992, pp. 288-292, IEEE/CHMT.
Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.
Lu, H. et al., "Predicting Optimal Process Conditions for Flip-Chip Assembly Using Copper Column Bumped Dies", Electronics Packaging Technology Conference, 2002, pp. 338-343.
Kawahara, Toshimi, "SuperCSP", IEEE Transactions on Advanced Packaging, May 2000, pp. 215-219, vol. 23, No. 2.
Chen et al., "Advanced Flip-Chip Package Production Solution for 40nm/28nm Technology Nodes", International Electron Devices Meeting, pp. 768-771, IEEE 2010.
Gerber et al., "Next Generation Fine Pitch Cu Pillar Technology—Enabling Next Generation Silicon Nodes", Electronic Components and Technology Conference, pp. 612-618, 2011.
He et al., "All-Copper Chip-to-Substrate Interconnects Part II. Modeling and Design", Journal of the Electrochemical Society, 155(4):D314-D322, 2008.
Pendse et al., "Bon-on-Lead: A Novel Flip Chip Interconnection Technology for Fine Effective Pitch and High I/O Density", Electronic Components and Technology Conference, pp. 16-23, 2006.

* cited by examiner

SEMICONDUCTOR DEVICE AND METHOD OF FORMING ELECTRICAL INTERCONNECT WITH STRESS RELIEF VOID

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CLAIM TO DOMESTIC PRIORITY

The present application is a *reissue of U.S. patent application Ser. No. 12/963,934, filed Dec. 9, 2010, now U.S. Pat. No. 8,350,384, which is a* continuation-in-part of U.S. patent application Ser. No. 12/624,482, filed Nov. 24, 2009, [and] *now U.S. Pat. No. 8,129,841, and reissued as U.S. Pat. No. RE44,608, which is a continuation of U.S. patent application Ser. No. 11/640,468, filed Dec. 14, 2006, now abandoned, which claims the benefit of provisional application Ser. No. 60/597,648, filed Dec. 14, 2005. U.S. patent application Ser. No. 11/640,468 is a continuation-in-part of U.S. patent application Ser. No. 11/388,755, filed Mar. 24, 2006, now abandoned, which claims the benefit of provisional application Ser. No. 60/665,208, filed Mar. 25, 2005. U.S. patent application Ser. No. 11/640,468 is further a continuation-in-part of U.S. patent application Ser. No. 10/985,654, filed Nov. 10, 2004, now U.S. Pat. No. 7,368,817, which claims the benefit of provisional application Ser. No. 60/518,864, filed Nov. 10, 2003 and provisional application Ser. No. 60/533,918, filed Dec. 31, 2003. U.S. patent application Ser. No. 12/963,934, filed Dec. 9, 2010, now U.S. Pat No. 8,350,384, is further a continuation-in-part of U.S. patent application* Ser. No. 12/643,180, filed Dec. 21, 2009, [and claims priority to the foregoing parent applications pursuant to 35 U.S.C. §120], *now U.S. Pat. No. 8,216,930, and reissued as U.S. Pat. No. RE44,761, which is a division of U.S. patent application Ser. No. 11/640,534, filed Dec. 14, 2006, now U.S. Pat. No. 7,659,633, and reissued as U.S. Pat. No. RE44,562, which claims the benefit of provisional application Ser. No. 60/597,648, filed Dec. 14, 2005. U.S. patent application Ser. No. 11/640,534 is a further a continuation-in-part of U.S. patent application Ser. No. 11/388,755, filed Mar. 24, 2006, now abandoned, which claims the benefit of provisional application Ser. No. 60/665,208, filed Mar. 25, 2005. U.S. patent application Ser. No. 11/640,534 is a continuation-in-part of U.S. patent application Ser. No. 10/985,654, filed Nov. 10, 2004, now U.S. Pat. No. 7,368,817, which claims the benefit of provisional application Ser. No. 60/518,864, filed Nov. 10, 2003 and provisional application Ser. No. 60/533,918, filed Dec. 31, 2003.*

FIELD OF THE INVENTION

The present invention relates to semiconductor devices and, particularly, to a semiconductor device and method of forming an electrical interconnect with a stress relief void.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

In a conventional flipchip type package, a semiconductor die is mounted to a package substrate with the active side of the die facing the substrate. The substrate contains a dielectric layer and metal layers, patterned to provide substrate circuitry, which includes among other features traces or leads routed to interconnect pads. The metal layer can be patterned by a mask and etch process. The interconnection of the circuitry in the semiconductor die with circuitry in the substrate is made by way of bumps which are attached to an array of interconnect pads on the die, and bonded to a corresponding complementary array of interconnect pads or capture pads on the substrate. The capture pads are typically about 2 to 4 times the nominal or design width of the leads. The interconnect area on the capture pad is approximately equal to the interconnect area on the die pad.

The areal density of electronic features on integrated circuits has increased enormously, and a semiconductor die having a greater density of circuit features also may have a greater density of sites for interconnection with the package substrate.

The package is connected to underlying circuitry, such as a printed circuit board or motherboard, by way of second level interconnects between the package and underlying circuit. The second level interconnects have a greater pitch than the flipchip interconnects so the routing on the substrate conventionally fans out. Significant technological advances have enabled construction of fine lines and spaces. In the conventional arrangement, space between adjacent pads limits the number of traces than can escape from the more inward capture pads in the array. The fan-out routing between the capture pads beneath the semiconductor die and external pins of the package is formed on multiple metal layers within the package substrate. For a complex interconnect array, substrates having multiple layers can be required to achieve routing between the die pads and second level interconnects on the package.

Multiple layer substrates are expensive and, in conventional flipchip constructs, the substrate alone typically accounts for more than half the package cost. The high cost of multilayer substrates has been a factor in limiting proliferation of flipchip technology in mainstream products. The escape routing pattern typically introduces additional electrical parasitics because the routing includes short runs of unshielded wiring and vias between wiring layers in the signal transmission path. Electrical parasitics can significantly limit package performance.

The conventional flipchip interconnection is made by using a melting process to join the bumps onto corresponding interconnect sites on the patterned metal layer at the die attach surface of the substrate. Where the site is a capture pad, the interconnect is known as a bump-on-capture pad (BOC) interconnect. In the BOC design, a comparatively large capture pad is required to mate with the bump on the semiconductor die. In some flipchip interconnections, an insulating material or solder mask is required to confine the flow of solder during the interconnection process. The solder mask opening defines the contour of the melted solder at the capture pad, i.e., solder mask defined, or the solder contour may not be defined by the mask opening, i.e., non-solder mask defined. In the latter case, the solder mask opening is significantly larger than the capture pad. Since the techniques for defining solder mask openings have wide tolerance ranges for a solder mask defined bump configuration, the capture pad must be large, typically considerably larger than the design size for the mask opening, to ensure that the mask opening will be located on the mating surface of the pad. The larger width of the capture pads results in considerable loss of routing space on the top substrate layer. In particular, the escape routing pitch is much larger than the finest trace pitch that the substrate technology can offer. A significant number of pads must be routed on lower substrate layers by means of short stubs and vias, often beneath the footprint of the die, emanating from the pads in question.

FIG. 1a shows a portion of a conventional flipchip package, in diagrammatic sectional view taken in a plane perpendicular to the package substrate surface. A die attach surface of package substrate 10 includes a patterned electrically conductive layer formed on a dielectric layer. The conductive layer is patterned to form leads and capture pads 16. An insulating layer or masking layer 11 covers the die attach surface of substrate 10. Masking layer 11 is a photodefinable material patterned with photoresist to have mask openings 12 which expose the mating surfaces of capture pads 16. Bumps 17 attached to under bump metallization (UBM) 18 on the active side of semiconductor die 14 are joined to the corresponding capture pads 16 on substrate 10 to form appropriate electrical interconnection between the circuitry on the die and leads on the substrate. The active side of semiconductor die 14 is covered, except at the contact surfaces of UBM 18, with a passivation layer 15, such as polyimide. After the reflowed solder is cooled to establish the electrical connection, an underfill material 20 is introduced into the space between semiconductor die 14 and substrate 10 to mechanically stabilize the interconnect and protect the features between the die and the substrate.

In such a conventional flipchip interconnect arrangement, signal escape traces in the upper metal layer of the substrate are routed from their respective capture pads across the die edge location, and away from the die footprint. Capture pads 16 are typically much larger than the trace width. For example, capture pads 16 are arranged in a 210 micrometer (μm) two-row area array pitch in a masking layer defined configuration with one signal trace between adjacent capture pads in the marginal row. The effective escape pitch is 105 μm. The escape pitch is adequate to route a significant proportion of integrated circuit designs that commonly employ flipchip interconnection on a single metallization layer, based on the inherent input/output (I/O) density of the IC device architectures.

FIG. 1a shows a masking layer defined solder contour. As the fusible material of the bumps on the die melts, the molten solder tends to wet the metal of the capture pads, and the solder tends to run out over any contiguous metal surfaces that are not masked. The solder tends to flow along the underlying pad and exposed contiguous lead. In a masking layer defined contour, the solder flow is limited by the masking layer, i.e., the width of mask opening 12. In a non-masking layer defined solder contour, the flow of solder along the lead is limited at least in part by a patterned deposition of non-solder-wettable material on the lead surface.

A thermal-induced movement in the x-y plane of die pads on the die attach surface of semiconductor die 14 in relation to the corresponding points on substrate 10, as indicated by arrow 13, can result in stresses to the interconnections between the die pad and interconnect site on the substrate. Various temperature-induced dimensional changes between semiconductor die 14 and substrate 10 are shown in the plan view in FIG. 1b. If there is a significant mismatch between the coefficient of thermal expansion (CTE) of semiconductor die 14 and the CTE of substrate 10, then the die is subject to movement, as shown by arrows 22, relative to the substrate in the x-y plane parallel to the plane of the substrate as the temperature changes, e.g., during thermal cycling in assembly or test or die burnout routines. For example, assume semiconductor die 14 has a footprint occupying area 24a at a low temperature. At higher temperatures, the footprint of semiconductor die 14 expands to area 24b.

In addition, movement in the x-y plane of a die pad in relation to an underlying contact pad can result in stresses to the interconnection between the pad and the contact pad.

The relative movement between semiconductor die 14 and substrate 10 asserts stress on bumps 17, which can cause bump detachment and device failure, particularly at location 26 between the bump and die pad.

SUMMARY OF THE INVENTION

A need exists to minimize the contact pad size to increase trace routing density without impacting electrical functionality or manufacturing reliability. Accordingly, in one embodiment, the present invention is a method of making a semiconductor device comprising the steps of providing a semiconductor die having a plurality of tapered bumps formed over a surface of the semiconductor die, providing a substrate, forming a plurality of conductive traces over the substrate with interconnect sites, forming a masking layer over the substrate with a plurality of openings over the conductive traces, bonding the tapered bumps to the interconnect sites so that the tapered bumps contact the mask layer and conductive traces to form a void within the opening of the mask layer over the substrate, and depositing an encapsulant around the tapered bumps between the semiconductor die and substrate.

In another embodiment, the present invention is a method of making a semiconductor device comprising the steps of providing a semiconductor die, providing a substrate, forming a plurality of conductive traces over the substrate with interconnect sites, forming a masking layer over the substrate with a plurality of openings over the conductive traces, forming a plurality of tapered interconnect structures between the semiconductor die and the interconnect sites of the substrate, and depositing an encapsulant between the semiconductor die and substrate.

In another embodiment, the present invention is a method of making a semiconductor device comprising the steps of providing a semiconductor die, providing a substrate, forming a plurality of conductive traces over the substrate with interconnect sites, forming a masking layer over the substrate with a plurality of openings over the conductive traces, and forming a plurality of tapered interconnect structures between the semiconductor die and the interconnect sites of the substrate.

In another embodiment, the present invention is a semiconductor device comprising a semiconductor die and substrate having a plurality of conductive traces formed over the substrate with interconnect sites. A masking layer is formed over the substrate with a plurality of openings over the conductive traces. A plurality of tapered interconnect structures is formed between the semiconductor die and the interconnect sites of the substrate. An encapsulant is deposited between the semiconductor die and substrate.

DETAILED DESCRIPTION OF THE DRAWINGS

Figure 1A:
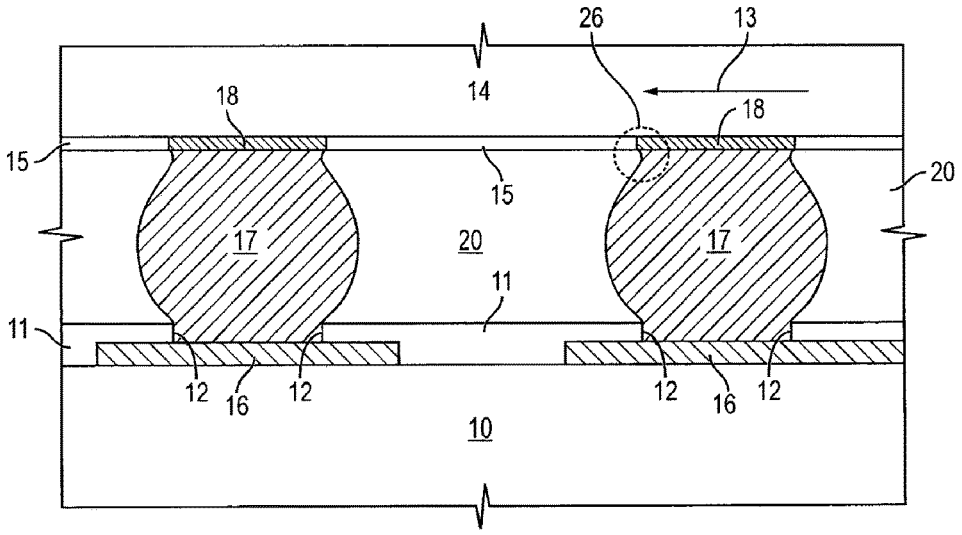
FIG. 1a (PRIOR ART)
FIGS. 1a-1b illustrate a conventional BOC flipchip interconnection.
Figure 1B:
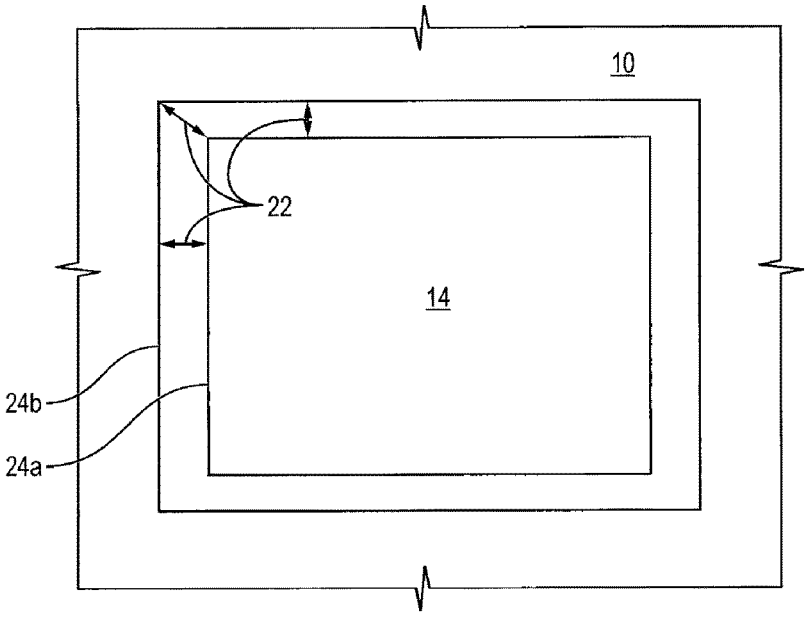
FIG. 1b (PRIOR ART)

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
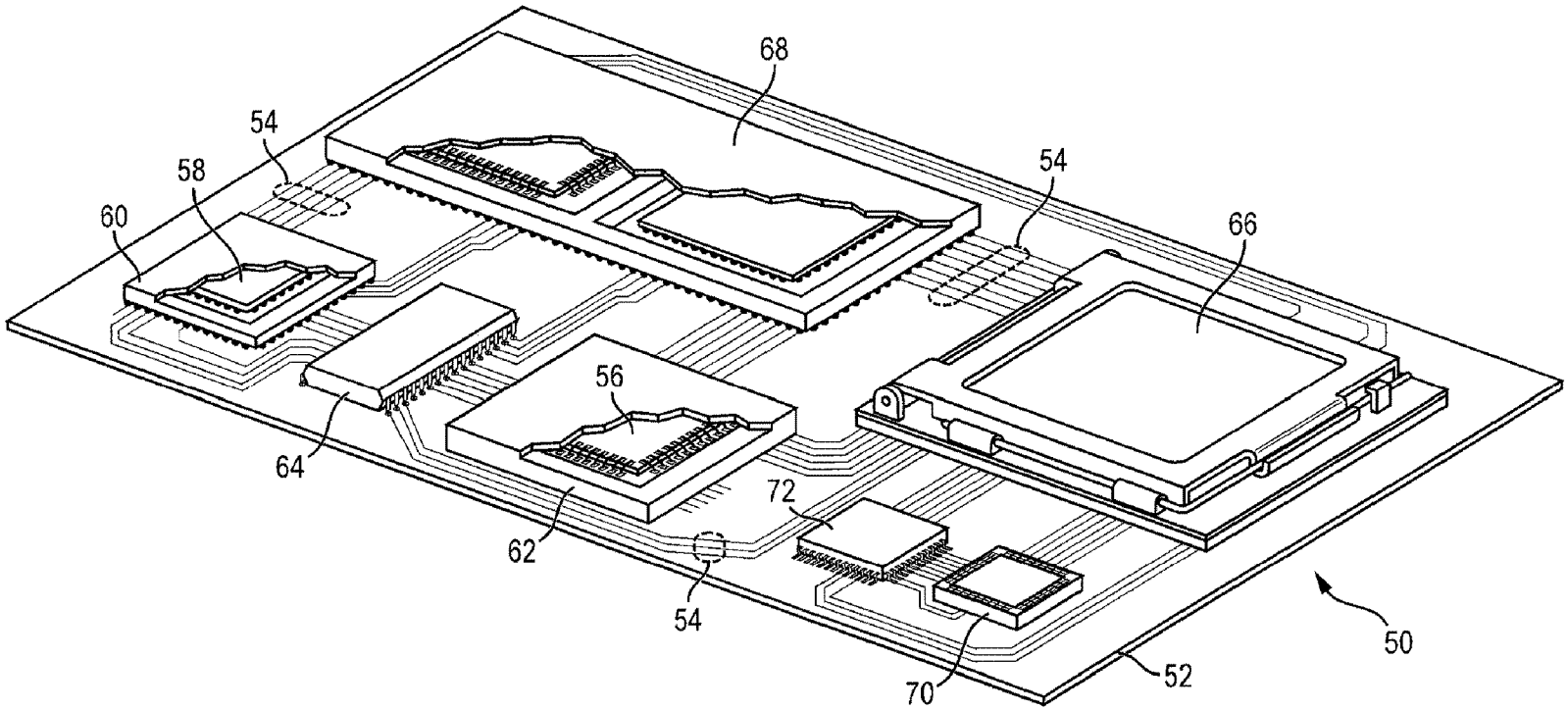
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
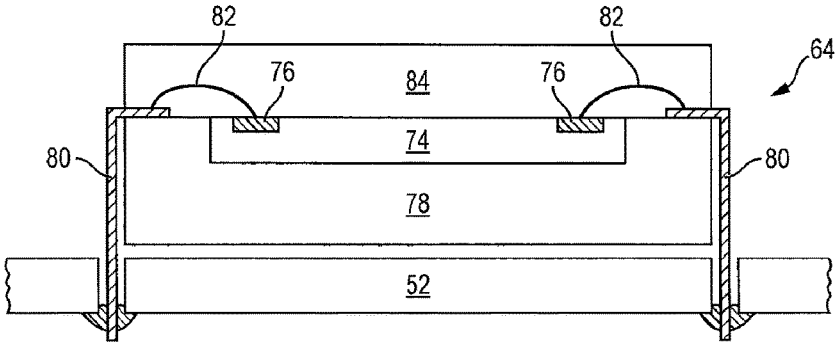
FIGS. 3a-3c illustrate further detail of the representative semiconductor packages mounted to the PCB.
Figure 3B:
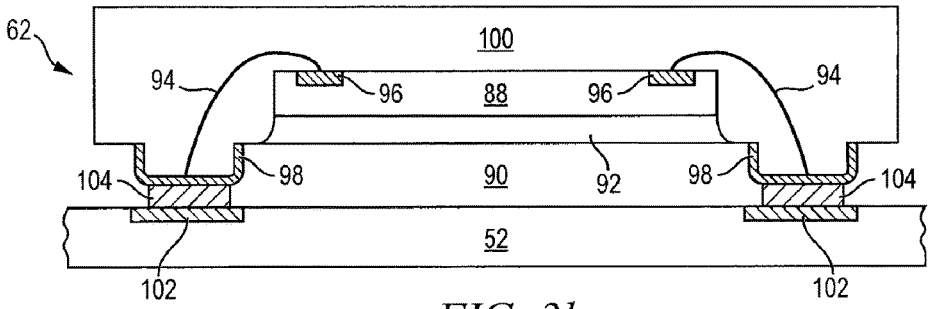
Figure 3C:
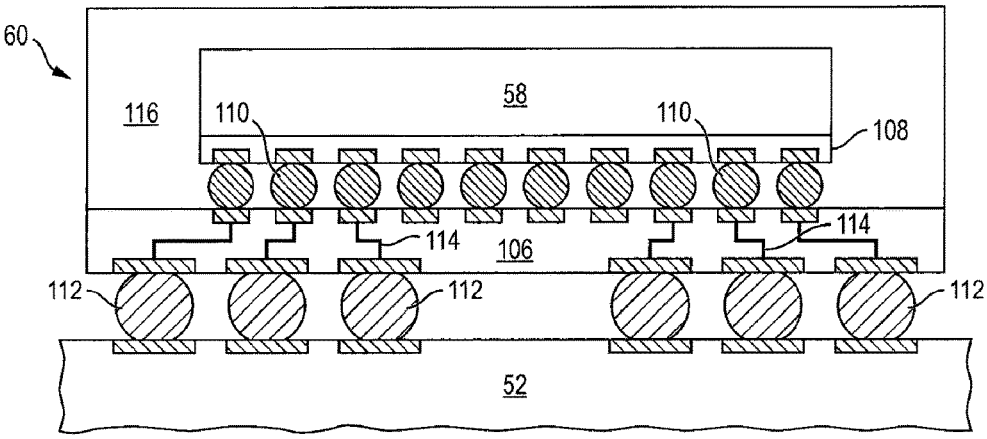

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

In a flipchip type semiconductor device, the electrical interconnect can be achieved by connecting the bump directly onto a lead, referred to as bump-on-lead (BOL) and described in U.S. patent publication 20050110164, or by connecting the bump directly onto a narrow interconnection pad, referred to as bump-on-narrow pad (BONP) and described in U.S. patent publication 20060216860, both incorporated by reference.

The BOL and BONP interconnect approaches can provide an efficient routing of traces on the substrate. Particularly, the signal routing can be formed entirely in a single metal layer of the substrate, which reduces the number of layers in the substrate. Forming the signal traces in a single layer also permits relaxation of the via, line, and space design rules for the substrate. The simplification of the substrate greatly reduces the overall cost of the flipchip package. The BOL interconnect also reduces vias and stubs from the substrate and enables a microstrip controlled impedance electrical environment for signal transmission, thereby greatly improving performance. Within selected design parameters, a BOL or BONP flipchip interconnection can be as reliable as a conventional bond on capture pad interconnect.

Figure 4A:
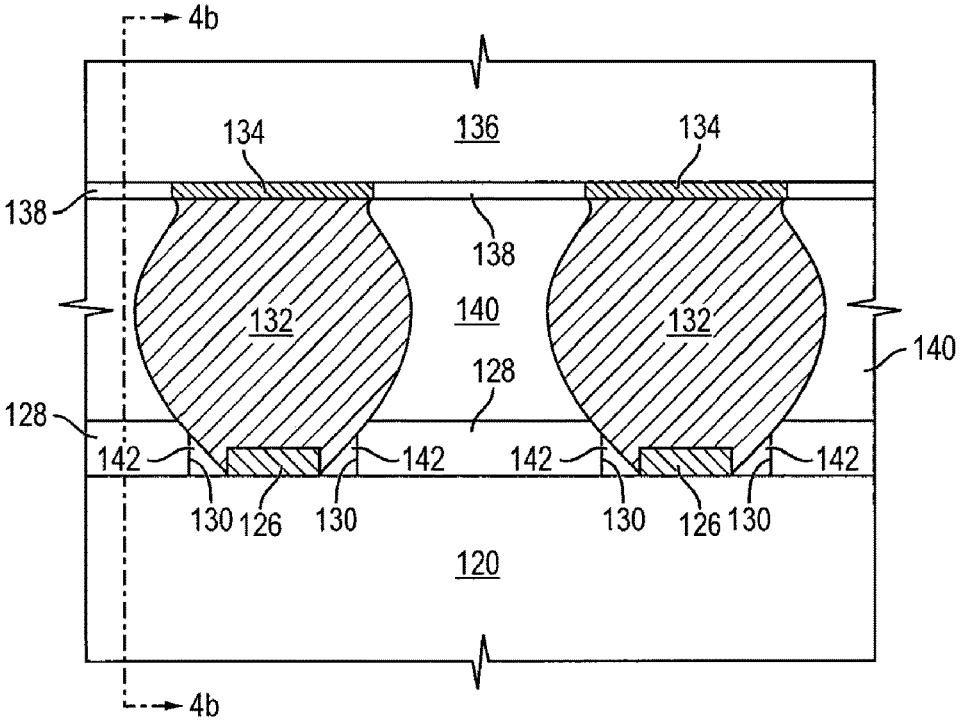
FIGS. 4a-4b illustrate a tapered interconnect structure for a flipchip semiconductor device.
Figure 4B:
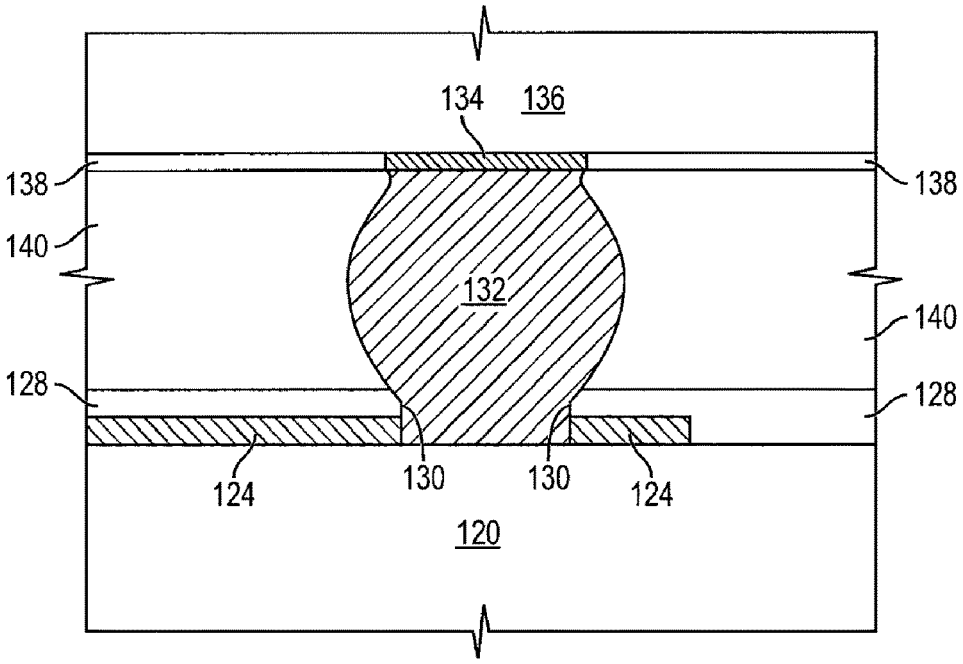

A BOL or BONP interconnection is shown in sectional views perpendicular to the surface of the substrate in FIGS. 4a and 4b with two electrical interconnects transverse to the lead, and one electrical interconnect parallel to the lead. In FIG. 4a, a die attach surface of package substrate 120 includes a patterned electrically conductive layer formed on a dielectric layer. Substrate 120 can be a build-up film substrate and laminate substrate. The conductive layer is patterned to form leads or traces 124 having interconnect sites 126. Although the width of the leads can vary over their length, no particular widening of the leads is formed at the interconnect sites or the leads can be widened to a limited extent at the interconnect sites.

The BOL or BONP interconnect is formed with or without a masking layer to confine the molten bump material during a re-melt stage in the process. The no masking layer option generally allows for finer interconnection geometry. When using a masking layer, openings are formed in the masking layer over the interconnect sites on the leads. FIG. 4a shows an insulating layer or masking layer 128 covering the die attach surface of substrate 120. Masking layer 128 can be a photo-definable material patterned by photoresist to have openings 130 which expose the top surface and side surfaces of interconnect sites 126. Masking layer 128 limits the flow of bump material along the length of leads 124. In other embodiments without a masking layer, substrate 120 can be treated to be non-wettable along portions of the leads adjacent the mating surfaces at interconnect sites 126 to limit flow of bump material away from the interconnect sites along the leads.

Bump 132 are attached to UBM 134 on the active side of semiconductor die 136 and joined to interconnect sites 126 on substrate 120 to form appropriate electrical interconnection between the circuitry on the die and the leads on the substrate. The active side of semiconductor die 136 is covered, except at the contact surfaces of UBM 134, with a passivation layer 138, such as polyimide. After the reflowed solder is cooled to establish the electrical connection, an underfill material 140 is deposited into the space between semiconductor die 134 and substrate 120 to mechanically stabilize the interconnects and protect the features between the die and the substrate.

The present flipchip interconnection uses a tapered bump 132 having a wedge shape, longer along a length of interconnect site 126 and narrower across the interconnect site. The view in FIG. 4a shows the shorter aspect or narrowing taper co-linear with trace 124. FIG. 4b shows the longer aspect of the wedge-shaped bump 124 taken along the line 4b-4b in FIG. 4a. The interconnect site 126 is narrower than the shorter aspect of bump 132 so the bump covers the top surface and side surface of the interconnect site. Bump 132 has a width of the connection to UBM 134 greater than, on the order of 1.5-4.0 times, a width of the connection to interconnect site 126. For example, the width of the connection at UBM 134 can be in a range about 50-150 μm and the width of the connection at interconnect site 126 is in the range 20-100 μm.

The tapered bump 132 can be more reliable than other interconnect structures formed on narrow leads. In particular, where the CTE of the semiconductor die differs significantly from the CTE of the substrate, tapering the interconnect structures can enhance reliability. For example, a significant CTE mismatch exists if the semiconductor die is silicon-based and the substrate is an organic laminate or build-up substrate. The material of the interconnect structure is selected to be close to that of the substrate. The CTE of a laminate or organic substrate is typically in a range about 16-18 ppm/degree C., the CTE of silicon is about 2-3 ppm/degree C., the CTE of glass ceramic is about 3-4 ppm/degree C., and the CTE of a co-fired ceramic is about 8-8.5 ppm/degree C. For the silicon semiconductor die and organic laminate substrate, the tapered interconnect structure is selected with a CTE in the range about 18-28 ppm/degree C.

Masking layer 128 makes contact with or is in close proximity to bump 132 at the margin of mask opening 130. During the underfill process, the contact or near proximity of masking layer 128 with bump 132 interferes with flow of underfill material 140 toward the portion of substrate 120 adjacent to the site. As a result, voids 142 containing the present atmosphere are formed between bump 132 and substrate 120 within mask opening 130 during the underfill process. The voids 142 adjacent to interconnect site 126 on substrate 120 provide stress relief from strain induced by changes in temperature.

In another embodiment, a composite bump structure electrically interconnects semiconductor die 136 and substrate 120. The composite bump structure has a non-collapsible portion and collapsible portion. The non-collapsible portion has a higher-melting temperature. The collapsible portion connects the bump to the interconnect site on the lead and has a lower-melting temperature. The collapsible portion of the composite bump can be a cap on the bump or solder paste or plated spot on the interconnect site. The non-collapsible portion is attached to the interconnect pad on the die. Typical materials for the non-collapsible portion include Cu, Au, Ni, high lead solder, or lead-tin alloy having high lead content. Typical materials for the collapsible portion of the composite bump include Cu, Ag, Sn, lead, and eutectic solders.

In another embodiment, solder paste can be applied to the interconnect sites on the traces. For example, the bumps can be formed of a high-lead solder, e.g., 97% lead and 3% tin, and the solder on the interconnect site can be a eutectic solder. The semiconductor die is oriented with its active side facing the mounting surface of the substrate and bumps aligned with the respective interconnect sites on the leads. The semiconductor die is moved toward the substrate to bring the bumps into contact with the solder on the leads. The assembly is then heated to reflow the solder at a peak temperature of 235° C. with jet flux to form the connection at the interconnect site. As the solder on the lead reflows, it wicks to the solder-wettable surface of the solder bump and to the solder-wettable mating surfaces of the lead. In FIG. 4a, the surface of substrate 120 is not solder-wettable so the solder makes little or no contact with the substrate dielectric. The tapered form of the connection structure results from the narrow dimension of the lead at the interconnect site, and the wicking of the solder during reflow.

As noted in the background, semiconductor die 136 and substrate 120 are subject to relative motion, particularly if there is a significant CTE mismatch. The registration of any point on the active surface of semiconductor die 136 with respect to a corresponding underlying point on the die attach surface of substrate 120 changes as the dimensions of the die and substrate change under the thermal stress. At some point on the active surface of semiconductor die 136, there is no net movement with relation to the corresponding point on the underlying substrate 120 as a result of expansion or contraction of the die in relation to the substrate. The point of no net movement is referred to as the thermally neutral point. In many cases, the thermally neutral point coincides with the geometric center of the die surface. The extent of movement of any point on semiconductor die 136 in an x-y plane parallel to the plane of substrate 120 in relation to the substrate as a result of thermal expansion or contraction, i.e., the thermal movement, depends at least in part upon the distance of that point from the thermally neutral point on the die. There is greater relative thermal movement at points nearer the edges of the die, and particularly near the corners of the die, than at points nearer the thermally neutral point.

The thermally-induced stress in BOL or BONP interconnections is less on leads that are oriented in a radial direction at the interconnect site toward the thermally neutral point on the semiconductor die than on leads that are oriented at the interconnect site perpendicularly to the radial direction. In FIGS. 4a-4b, the lengthwise dimension of interconnect site 126 is oriented in a direction approximately aligned toward the thermally neutral point of semiconductor die 136, or deviating less than 45 degrees from a thermally neutral alignment. In other embodiments, the deviation is less than 10 degrees from a thermally neutral alignment.

Figure 5A:
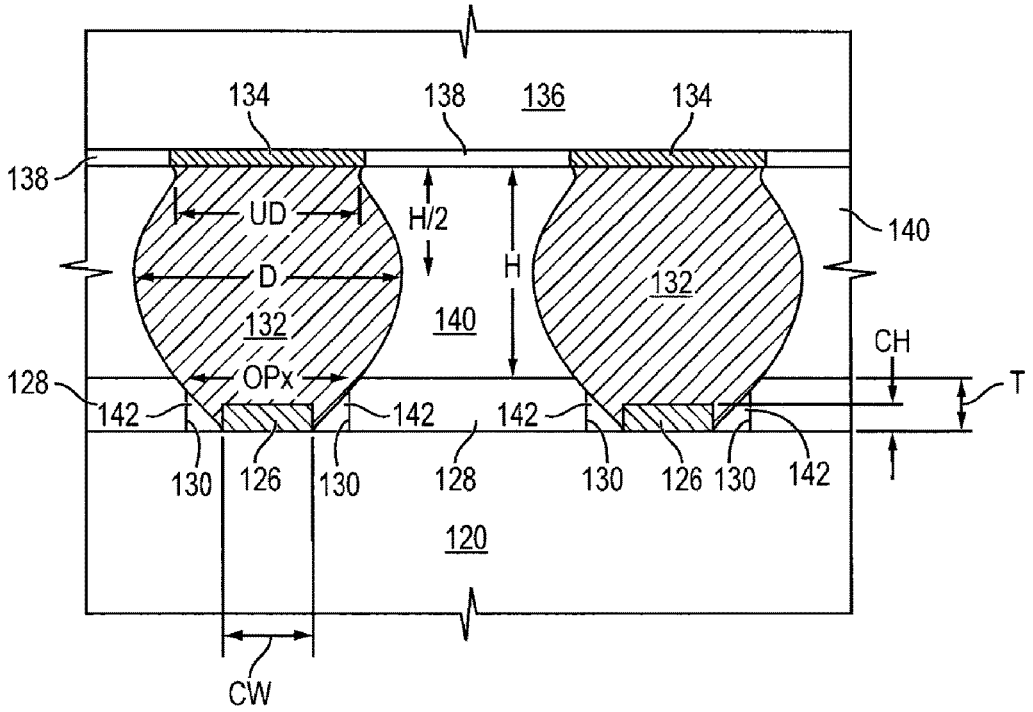
FIGS. 5a-5b illustrate dimensional references for FIGS. 4a-4b.
Figure 5B:
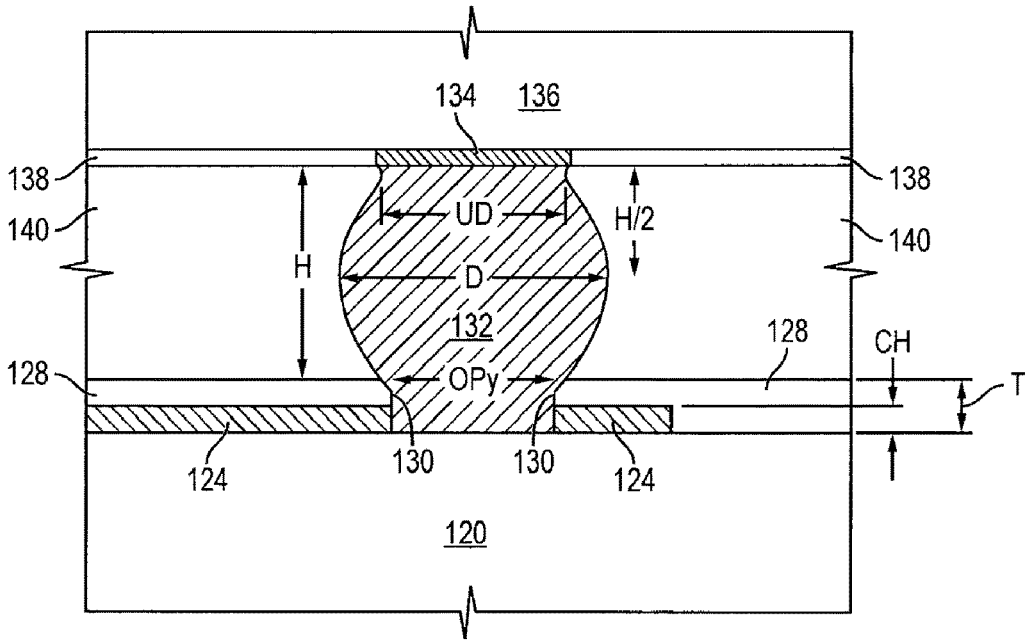

FIGS. 5a and 5b show dimensions of certain of the features of FIGS. 4a and 4b. The features are referenced as follows: H is interconnect height as measured from the die surface to the masking layer surface, D is bump diameter at half the interconnect height (H/2), UD is under bump metallization diameter, OPx is the mask opening width in the x-direction across the lead, OPy is the mask opening width in the y-direction along the lead, CW is the width of the copper lead at the interconnect site, CH is thickness or height of the lead at the interconnect site, and T is the masking layer thickness. In one embodiment, UD=90 μm, D=0.110 μm, H=75 μm, T=40 μm, CW=30 μm, and CH=20 μm.

The strain on the interconnect system is determined by the magnitude of the CTE mismatch between the semiconductor die and substrate. A high strain concentration occurs at the bump/die interface because of an abrupt difference in CTE. Accordingly, fatigue failure is driven by the concentration of plastic strain at the bump/die interface. In the BOL interconnect, because the bump is tapered, the portion of the bump near the substrate has a greater compliancy. In particular, there is a high compliancy region or stress relief structure at or near the narrow interface at the interconnect site on the trace. The relief structure has an effect of diffusing the strain away from the die pad, resulting in improved fatigue life of the system.

Figure 6:
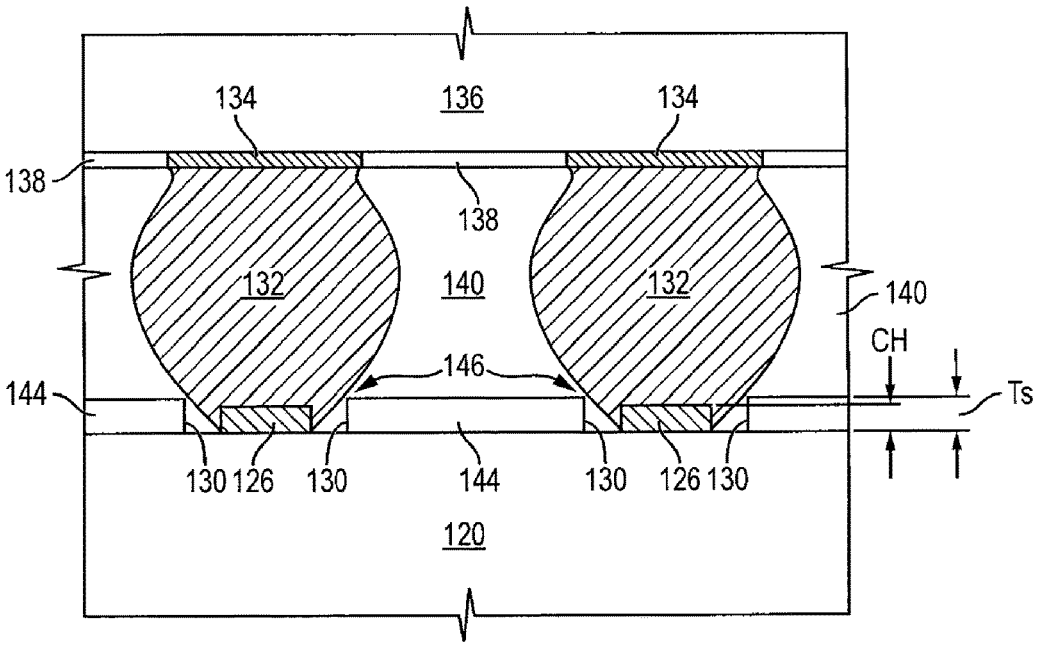
FIG. 6 illustrates a thinner masking layer to negate void formation.

FIG. 6 shows an embodiment, similar to FIGS. 4a-4b, masking layer 144 having a thickness $T_s$ less than masking layer thickness T in FIG. 5a. The thinner masking layer 144 allows underfill material 140 to pass through openings 146 between mask opening 130 and bump 132 to fill the area between the bump and substrate within the mask opening. Accordingly, there are substantially no voids between the bump and substrate within the mask opening.

FIGS. 7-10 describe other embodiments with various interconnect structures applicable to the interconnect structure, as described in FIGS. 4-6. FIG. 7a shows a semiconductor wafer 220 with a base substrate material 222, such as silicon, germanium, gallium arsenide, indium phosphide, or silicon carbide, for structural support. A plurality of semiconductor die or components 224 is formed on wafer 220 separated by saw streets 226 as described above.

Figure 7A:
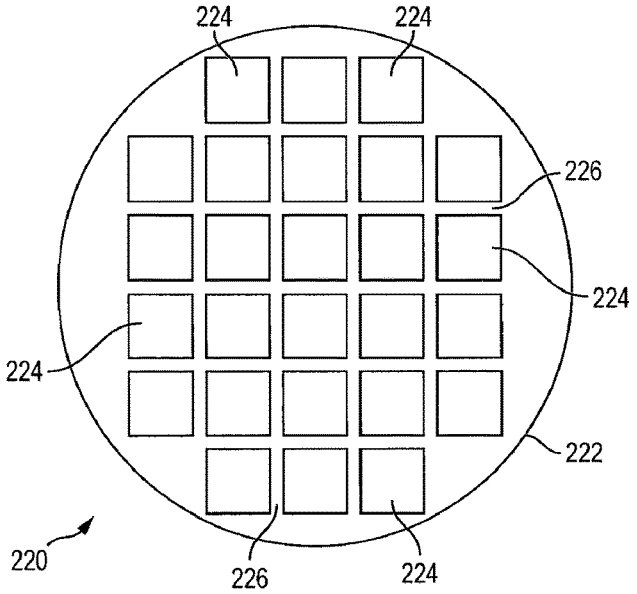
FIGS. 7a-7h illustrate various interconnect structures formed over a semiconductor die for bonding to conductive traces on a substrate.
Figure 7B:
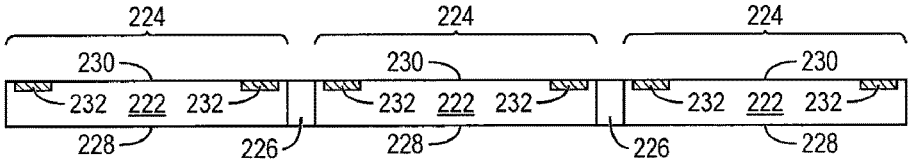

FIG. 7b shows a cross-sectional view of a portion of semiconductor wafer 220. Each semiconductor die 224 has a back surface 228 and active surface 230 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 230 to implement analog circuits or digital circuits, such as digital signal processor (DSP), ASIC, memory, or other signal processing circuit. Semiconductor die 224 can also contain integrated passive devices (IPDs), such as inductors, capacitors, and resistors, for RF signal processing. In one embodiment, semiconductor die 224 is a flipchip type semiconductor die.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230.

Figure 7C:
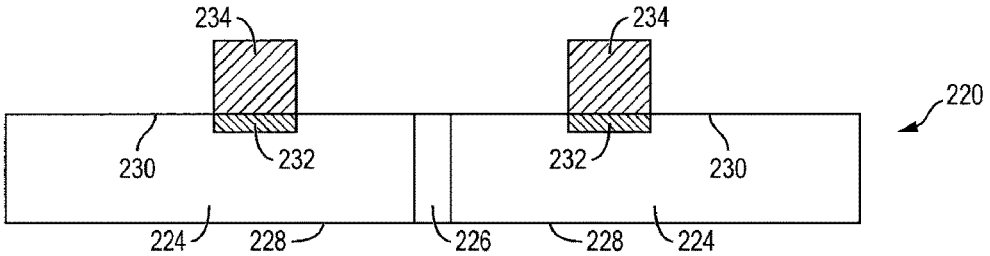
Figure 7D:
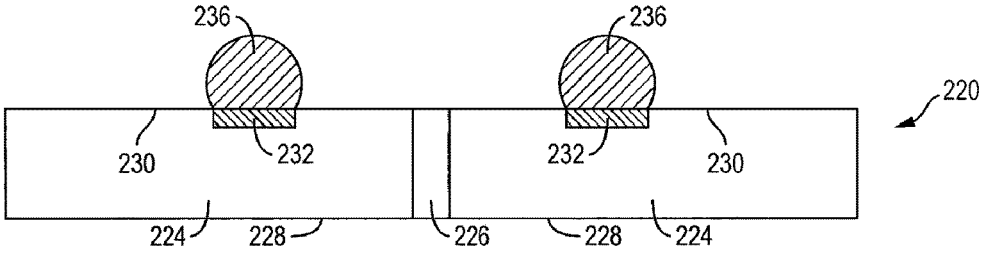

FIG. 7c shows a portion of semiconductor wafer 220 with an interconnect structure formed over contact pads 232. An electrically conductive bump material 234 is deposited over contact pads 232 using an evaporation, electrolytic plating, electroless plating, ball drop, or screen printing process. Bump material 234 can be Al, Sn, Ni, Au, Ag, Pb, Bi, Cu, solder, and combinations thereof, with an optional flux solution. For example, bump material 234 can be eutectic Sn/Pb, high-lead solder, or lead-free solder. Bump material 234 is generally compliant and undergoes plastic deformation greater than about 25 μm under a force equivalent to a vertical load of about 200 grams. Bump material 234 is bonded to contact pad 232 using a suitable attachment or bonding process. For example, bump material 234 can be compression bonded to contact pad 232. Bump material 234 can also be reflowed by heating the material above its melting point to form spherical balls or bumps 236, as shown in FIG. 7d. In some applications, bumps 236 are reflowed a second time to improve electrical connection to contact pad 232. Bumps 236 represent one type of interconnect structure that can be formed over contact pad 232. The interconnect structure can also use stud bump, micro bump, or other electrical interconnect.

Figure 7E:
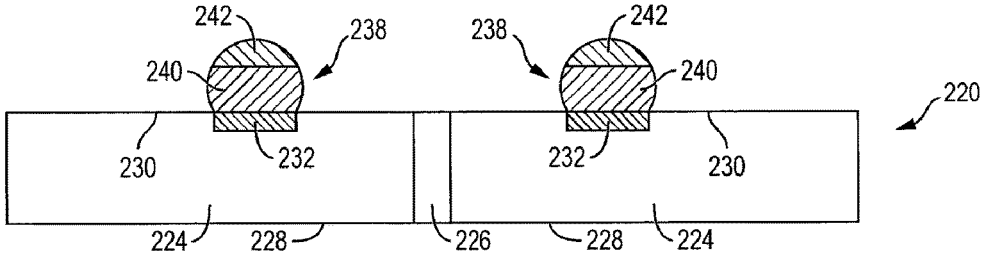

FIG. 7e shows another embodiment of the interconnect structure formed over contact pads 232 as composite bumps 238 including a non-fusible or non-collapsible portion 240 and fusible or collapsible portion 242. The fusible or collapsible and non-fusible or non-collapsible attributes are defined for bumps 238 with respect to reflow conditions. The non-fusible portion 240 can be Au, Cu, Ni, high-lead solder, or lead-tin alloy. The fusible portion 242 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 232 width or diameter of 100 μm, the non-fusible portion 240 is about 45 μm in height and fusible portion 242 is about 35 μm in height.

Figure 7F:
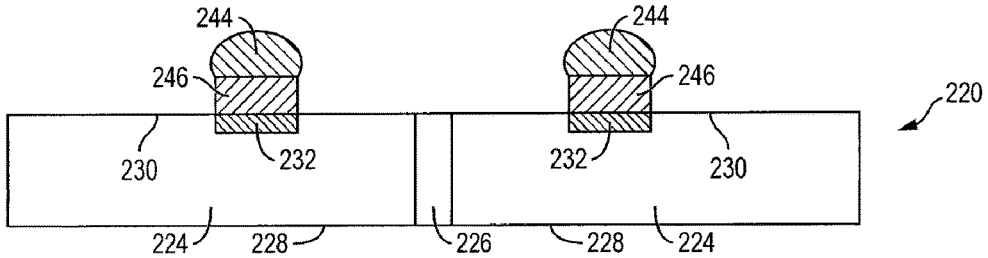

FIG. 7f shows another embodiment of the interconnect structure formed over contact pads 232 as bump 244 over conductive pillar 246. Bump 244 is fusible or collapsible and conductive pillar 246 is non-fusible or non-collapsible. The fusible or collapsible and non-fusible or non-collapsible attributes are defined with respect to reflow conditions. Bump 244 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 246 can be Au, Cu, Ni, high-lead solder, or lead-tin alloy. In one embodiment, conductive pillar 246 is a Cu pillar and bump 244 is a solder cap. Given a contact pad 232 width or diameter of 100 μm, conductive pillar 246 is about 45 μm in height and bump 244 is about 35 μm in height.

Figure 7G:
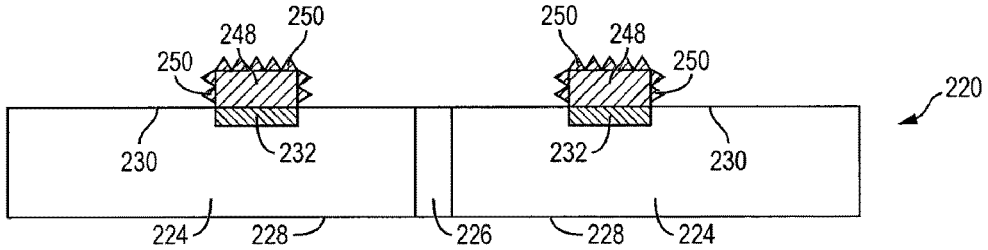

FIG. 7g shows another embodiment of the interconnect structure formed over contact pads 232 as bump material 248 with asperities 250. Bump material 248 is soft and deformable under reflow conditions with a low yield strength and high elongation to failure, similar to bump material 234. Asperities 250 are formed with a plated surface finish and are shown exaggerated in the figures for purposes of illustration. The scale of asperities 250 is generally in the order about 1-25 μm. The asperities can also be formed on bump 236, composite bump 238, and bump 244.

Figure 7H:
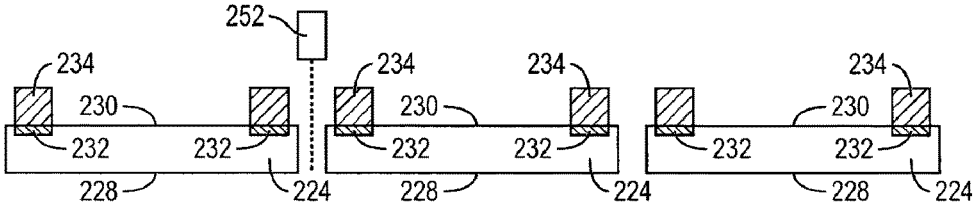

In FIG. 7h, semiconductor wafer 220 is singulated through saw street 226 using a saw blade or laser cutting tool 252 into individual semiconductor die 224.

Figure 8A:
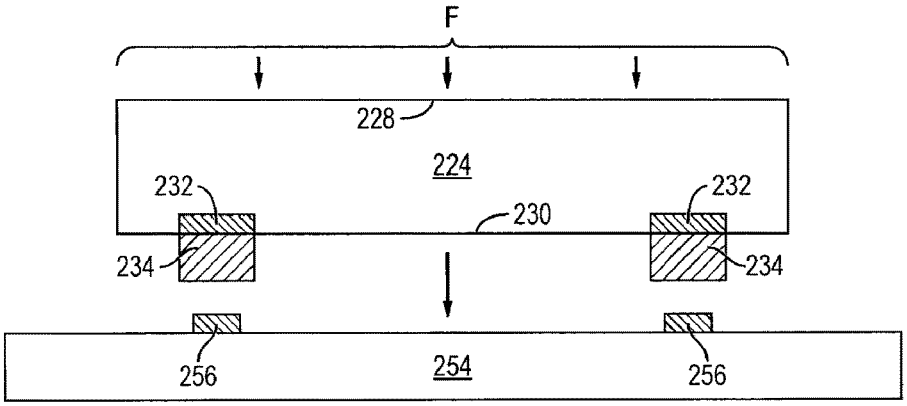
FIGS. 8a-8g illustrate the semiconductor die and interconnect structure bonded to the conductive traces.

FIG. 8a shows a substrate or PCB 254 with conductive trace 256. Substrate 254 can be a single-sided FR5 laminate or 2-sided BT-resin laminate. Semiconductor die 224 is positioned so that bump material 234 is aligned with an interconnect site on conductive trace 256, see FIGS. 16a-16g. Alternatively, bump material 234 can be aligned with a conductive pad or other interconnect site formed on substrate 254. Bump material 234 is wider than conductive trace 256. In one embodiment, bump material 234 has a width of less than 100 μm and conductive trace or pad 256 has a width of 35 μm for a bump pitch of 150 μm. Conductive traces 256 are applicable to the interconnect structure, as described in FIGS. 4-6.

Figure 8B:
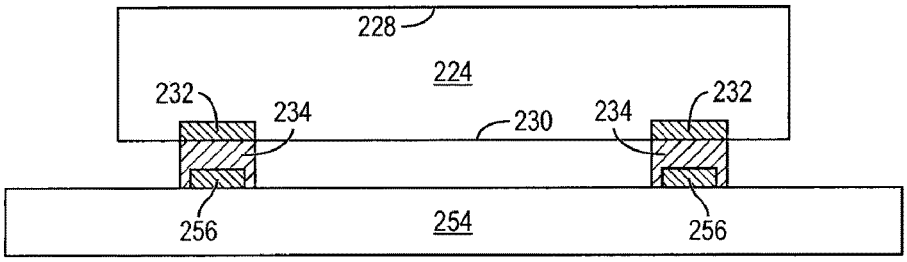

A pressure or force F is applied to back surface 228 of semiconductor die 224 to press bump material 234 onto conductive trace 256. The force F can be applied with an elevated temperature. Due to the compliant nature of bump material 234, the bump material deforms or extrudes around the top surface and side surface of conductive trace 256, referred to as BOL. In particular, the application of pressure causes bump material 234 to undergo a plastic deformation greater than about 25 μm under force F equivalent to a vertical load of about 200 grams and cover the top surface and side surface of the conductive trace, as shown in FIG. 8b. Bump material 234 can also be metallurgically connected to conductive trace 256 by bringing the bump material in physical contact with the conductive trace and then reflowing the bump material under a reflow temperature.

By making conductive trace 256 narrower than bump material 234, the conductive trace pitch can be reduced to increase routing density and I/O count. The narrower conductive trace 256 reduces the force F needed to deform bump material 234 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 234 around conductive trace 256 mechanically locks the bump to the trace to prevent die shifting or die floating during reflow.

Figure 8C:
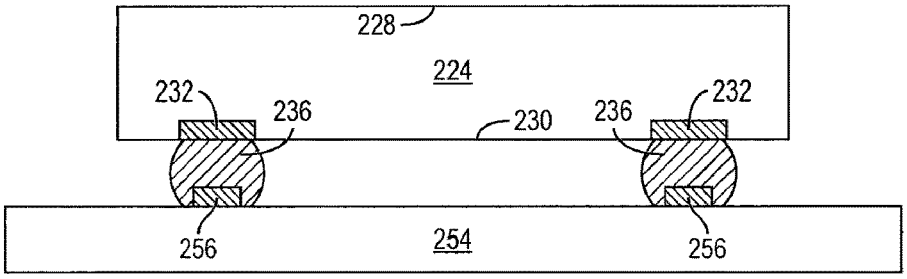

FIG. 8c shows bump 236 formed over contact pad 232 of semiconductor die 224. Semiconductor die 224 is positioned so that bump 236 is aligned with an interconnect site on conductive trace 256. Alternatively, bump 236 can be aligned with a conductive pad or other interconnect site formed on substrate 254. Bump 236 is wider than conductive trace 256. Conductive traces 256 are applicable to the interconnect structure, as described in FIGS. 4-6.

A pressure or force F is applied to back surface 228 of semiconductor die 224 to press bump 236 onto conductive trace 256. The force F can be applied with an elevated temperature. Due to the compliant nature of bump 236, the bump deforms or extrudes around the top surface and side surface of conductive trace 256. In particular, the application of pressure causes bump material 236 to undergo a plastic deformation and cover the top surface and side surface of conductive trace 256. Bump 236 can also be metallurgically connected to conductive trace 256 by bringing the bump in physical contact with the conductive trace under reflow temperature.

By making conductive trace 256 narrower than bump 236, the conductive trace pitch can be reduced to increase routing density and I/O count. The narrower conductive trace 256 reduces the force F needed to deform bump 236 around the conductive trace. For example, the requisite force F may be 30-500 of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 236 around conductive trace 256 mechanically locks the bump to the trace to prevent die shifting or die floating during reflow.

Figure 8D:
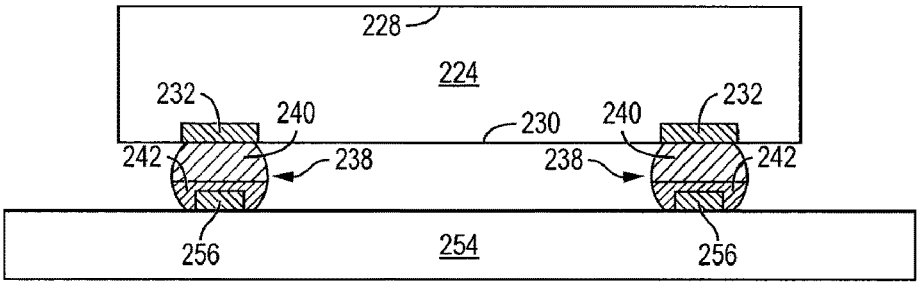

FIG. 8d shows composite bump 238 formed over contact pad 232 of semiconductor die 224. Semiconductor die 224 is positioned so that composite bump 238 is aligned with an interconnect site on conductive trace 256. Alternatively, composite bump 238 can be aligned with a conductive pad or other interconnect site formed on substrate 254. Composite bump 238 is wider than conductive trace 256. Conductive traces 256 are applicable to the interconnect structure, as described in FIGS. 4-6.

A pressure or force F is applied to back surface 228 of semiconductor die 224 to press fusible portion 242 onto conductive trace 256. The force F can be applied with an elevated temperature. Due to the compliant nature of fusible portion 242, the fusible portion deforms or extrudes around the top surface and side surface of conductive trace 256. In particular, the application of pressure causes fusible portion 242 to undergo a plastic deformation and cover the top surface and side surface of conductive trace 256. Composite bump 238 can also be metallurgically connected to conductive trace 256 by bringing fusible portion 242 in physical contact with the conductive trace under reflow temperature. The non-fusible portion 240 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces.

During a reflow process, a large number (e.g., thousands) of composite bumps 238 on semiconductor die 224 are attached to interconnect sites on conductive trace 256 of substrate 254. Some of the bumps 238 may fail to properly connect to conductive trace 256, particularly if die 224 is warped. Recall that composite bump 238 is wider than conductive trace 256. With a proper force applied, the fusible portion 242 deforms or extrudes around the top surface and side surface of conductive trace 256 and mechanically locks composite bump 238 to the conductive trace. The mechanical interlock is formed by nature of the fusible portion 242 being softer and more compliant than conductive trace 256 and therefore deforming over the top surface and around the side surface of the conductive trace for greater contact surface area. The mechanical interlock between composite bump 238 and conductive trace 256 holds the bump to the conductive trace during reflow, i.e., the bump and conductive trace do not lose contact. Accordingly, composite bump 238 mating to conductive trace 256 reduces bump interconnect failures.

Figure 8E:
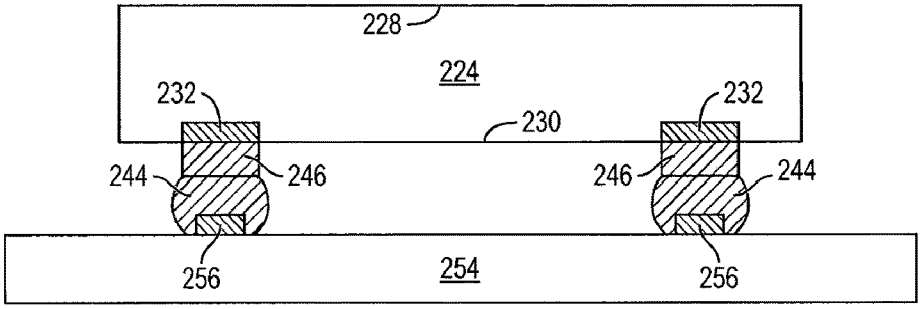

FIG. 8e shows conductive pillar 246 and bump 244 formed over contact pad 232 of semiconductor die 224. Semiconductor die 224 is positioned so that bump 244 is aligned with an interconnect site on conductive trace 256. Alternatively, bump 244 can be aligned with a conductive pad or other interconnect site formed on substrate 254. Bump 244 is wider than conductive trace 256. Conductive traces 256 are applicable to the interconnect structure, as described in FIGS. 4-6.

A pressure or force F is applied to back surface 228 of semiconductor die 224 to press bump 244 onto conductive trace 256. The force F can be applied with an elevated temperature. Due to the compliant nature of bump 244, the bump deforms or extrudes around the top surface and side surface of conductive trace 256. In particular, the application of pressure causes bump 244 to undergo a plastic deformation and cover the top surface and side surface of conductive trace 256. Conductive pillar 246 and bump 244 can also be metallurgically connected to conductive trace 256 by bringing the bump in physical contact with the conductive trace under reflow temperature. Conductive pillar 246 does not melt or deform during the application of pressure or temperature and retains its height and shape as a vertical standoff between semiconductor die 224 and substrate 254. The additional displacement between semiconductor die 224 and substrate 254 provides greater coplanarity tolerance between the mating surfaces. The wider bump 244 and narrower conductive trace 256 have similar low requisite compressive force and mechanical locking features and advantages described above for bump material 234 and bump 236.

Figure 8F:
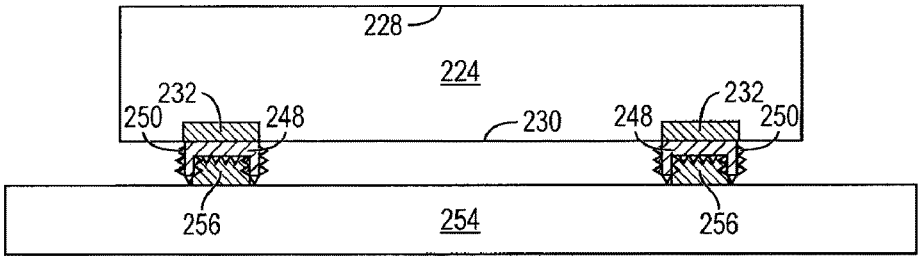

FIG. 8f shows bump material 248 with asperities 250 formed over contact pad 232 of semiconductor die 224. Semiconductor die 224 is positioned so that bump material 248 is aligned with an interconnect site on conductive trace 256. Alternatively, bump material 248 can be aligned with a conductive pad or other interconnect site formed on substrate 254. Bump material 248 is wider than conductive trace 256. A pressure or force F is applied to back surface 228 of semiconductor die 224 to press bump material 248 onto conductive trace 256. The force F can be applied with an elevated temperature. Due to the compliant nature of bump material 248, the bump deforms or extrudes around the top surface and side surface of conductive trace 256. In particular, the application of pressure causes bump material 248 to undergo a plastic deformation and cover the top surface and side surface of conductive trace 256. In addition, asperities 250 are metallurgically connected to conductive trace 256. Asperities 250 are sized on the order about 1-25 μm.

Figure 8G:
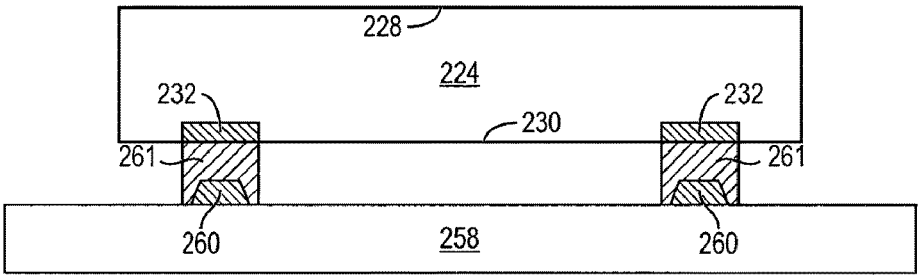

FIG. 8g shows a substrate or PCB 258 with trapezoidal conductive trace 260 having angled or sloped sides. Bump material 261 is formed over contact pad 232 of semiconductor die 224. Semiconductor die 224 is positioned so that bump material 261 is aligned with an interconnect site on conductive trace 260. Alternatively, bump material 261 can be aligned with a conductive pad or other interconnect site formed on substrate 258. Bump material 261 is wider than conductive trace 260. Conductive traces 260 are applicable to the interconnect structure, as described in FIGS. 4-6.

A pressure or force F is applied to back surface 228 of semiconductor die 224 to press bump material 261 onto conductive trace 260. The force F can be applied with an elevated temperature. Due to the compliant nature of bump material 261, the bump material deforms or extrudes around the top surface and side surface of conductive trace 260. In particular, the application of pressure causes bump material 261 to undergo a plastic deformation under force F to cover the top surface and the angled side surface of conductive trace 260. Bump material 261 can also be metallurgically connected to conductive trace 260 by bringing the bump material in physical contact with the conductive trace and then reflowing the bump material under a reflow temperature.

FIGS. 9a-9d show a BOL embodiment of semiconductor die 224 and elongated composite bump 262 having a non-fusible or non-collapsible portion 264 and fusible or collapsible portion 266. The non-fusible portion 264 can be Au, Cu, Ni, high-lead solder, or lead-tin alloy. The fusible portion 266 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 264 makes up a larger part of composite bump 262 than the fusible portion 266. The non-fusible portion 264 is fixed to contact pad 232 of semiconductor die 224.

Figure 9A:
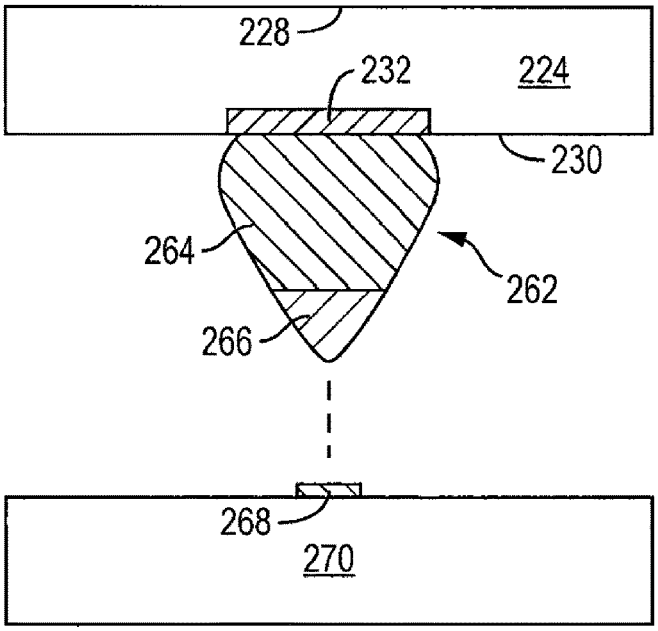
FIGS. 9a-9d illustrate the semiconductor die with a wedge-shaped interconnect structure bonded to the conductive traces.
Figure 9B:
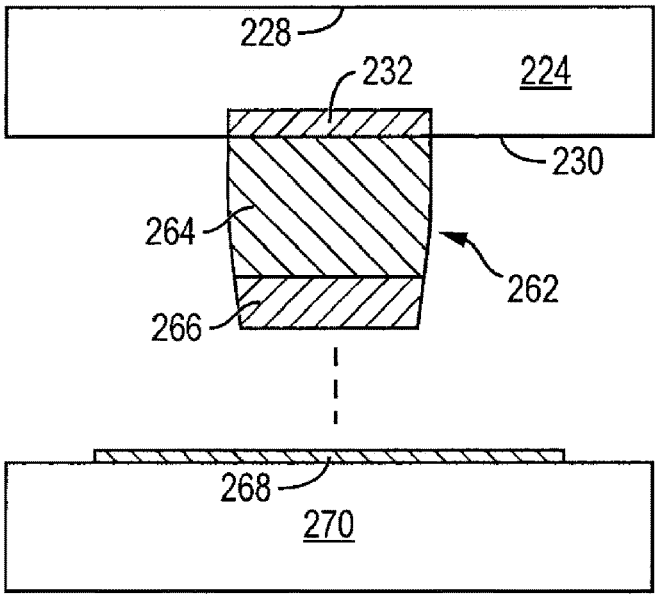
Figure 9C:
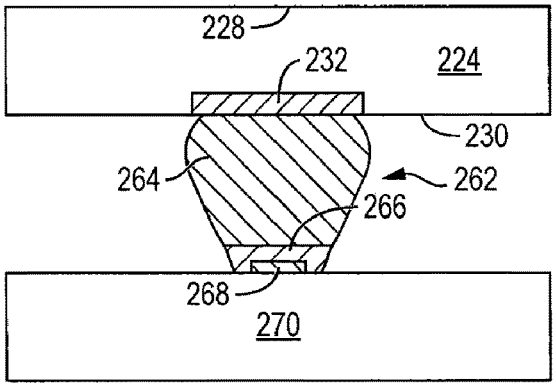
Figure 9D:
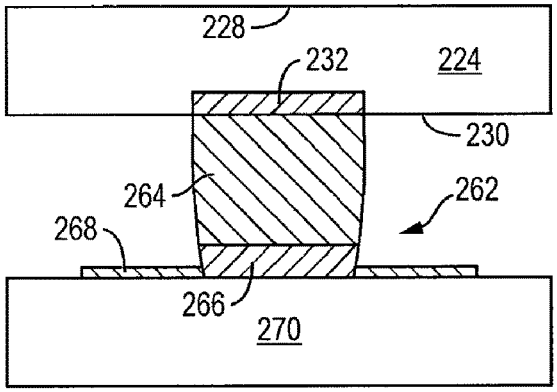

Semiconductor die 224 is positioned so that composite bump 262 is aligned with an interconnect site on conductive trace 268 formed on substrate 270, as shown in FIG. 9a. Composite bump 262 is tapered along conductive trace 268, i.e., the composite bump has a wedge shape, longer along a length of conductive trace 268 and narrower across the conductive trace. The tapered aspect of composite bump 262 occurs along the length of conductive trace 268. The view in FIG. 9a shows the shorter aspect or narrowing taper colinear with conductive trace 268. The view in FIG. 9b, normal to FIG. 9a, shows the longer aspect of the wedge-shaped composite bump 262. The shorter aspect of composite bump 262 is wider than conductive trace 268. The fusible portion 266 collapses around conductive trace 268 upon application of pressure and/or reflow with heat, as shown in FIGS. 9c and 9d. The non-fusible portion 264 does not melt or deform during reflow and retains its form and shape. The non-fusible portion 264 can be dimensioned to provide a standoff distance between semiconductor die 224 and substrate 270. A finish such as Cu OSP can be applied to substrate 270. Conductive traces 268 are applicable to the interconnect structure, as described in FIGS. 4-6.

During a reflow process, a large number (e.g., thousands) of composite bumps 262 on semiconductor die 224 are attached to interconnect sites on conductive trace 268 of substrate 270. Some of the bumps 262 may fail to properly connect to conductive trace 268, particularly if semiconductor die 224 is warped. Recall that composite bump 262 is wider than conductive trace 268. With a proper force applied, the fusible portion 266 deforms or extrudes around the top surface and side surface of conductive trace 268 and mechanically locks composite bump 262 to the conductive trace. The mechanical interlock is formed by nature of the fusible portion 266 being softer and more compliant than conductive trace 268 and therefore deforming around the top surface and side surface of the conductive trace for greater contact area. The wedge-shape of composite bump 262 increases contact area between the bump and conductive trace, e.g., along the longer aspect of FIGS. 9b and 9d, without sacrificing pitch along the shorter aspect of FIGS. 9a and 9c. The mechanical interlock between composite bump 262 and conductive trace 268 holds the bump to the conductive trace during reflow, i.e., the bump and conductive trace do not lose contact. Accordingly, composite bump 262 mating to conductive trace 268 reduces bump interconnect failures.

Figure 10A:
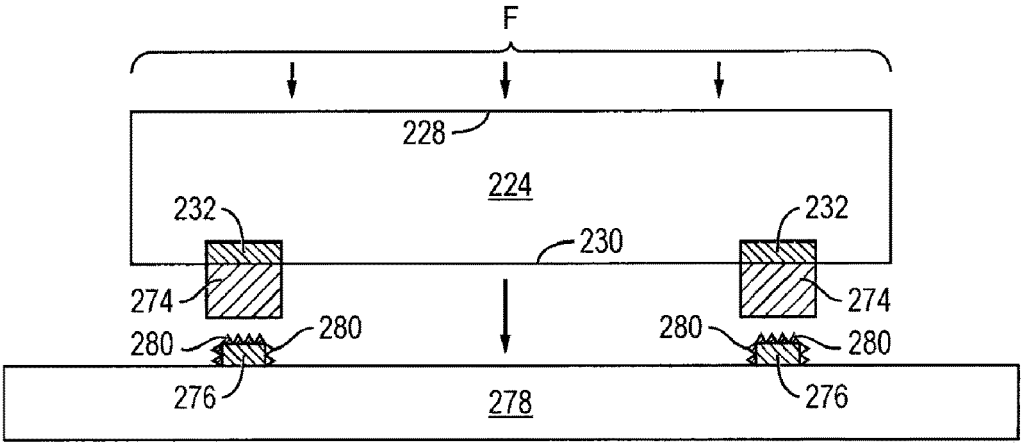
FIGS. 10a-10d illustrate another embodiment of the semiconductor die and interconnect structure bonded to the conductive traces.

FIGS. 10a-10d show a BOL embodiment of semiconductor die 224 with bump material 274 formed over contact pads 232, similar to FIG. 7c. In FIG. 10a, bump material 274 is generally compliant and undergoes plastic deformation greater than about 25 μm under a force equivalent to a vertical load of about 200 grams. Bump material 274 is wider than conductive trace 276 on substrate 278. A plurality of asperities 280 is formed on conductive trace 276 with a height on the order about 1-25 μm.

Figure 10B:
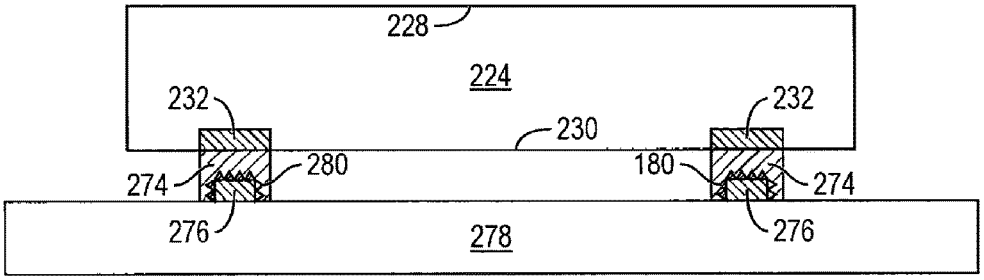

Semiconductor die 224 is positioned so that bump material 274 is aligned with an interconnect site on conductive trace 276. Alternatively, bump material 274 can be aligned with a conductive pad or other interconnect site formed on substrate 278. A pressure or force F is applied to back surface 228 of semiconductor die 224 to press bump material 274 onto conductive trace 276 and asperities 280, as shown in FIG. 10b. The force F can be applied with an elevated temperature. Due to the compliant nature of bump material 274, the bump material deforms or extrudes around the top surface and side surface of conductive trace 276 and asperities 280. In particular, the application of pressure causes bump material 274 to undergo a plastic deformation and cover the top surface and side surface of conductive trace 276 and asperities 280. The plastic flow of bump material 274 creates macroscopic mechanical interlocking points between the bump material and the top surface and side surface of conductive trace 276 and asperities 280. The plastic flow of bump material 274 occurs around the top surface and side surface of conductive trace 276 and asperities 280, but does not extend excessively onto substrate 278, which could cause electrical shorting and other defects. The mechanical interlock between the bump material and the top surface and side surface of conductive trace 276 and asperities 280 provides a robust connection with greater contact area between the respective surfaces, without significantly increasing the bonding force. The mechanical interlock between the bump material and the top surface and side surface of conductive trace 276 and asperities 280 also reduces lateral die shifting during subsequent manufacturing processes, such as encapsulation.

Figure 10C:
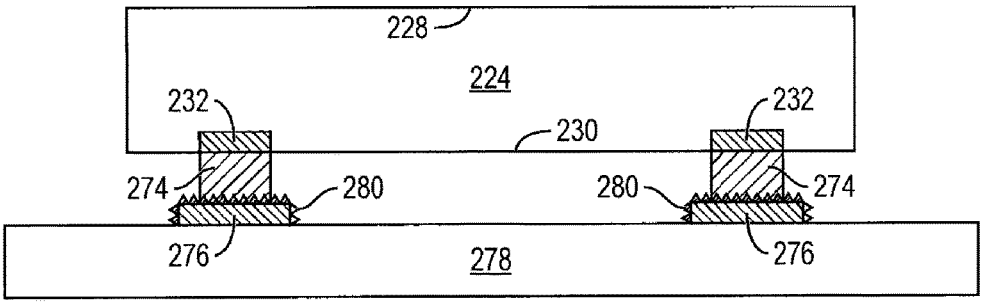

FIG. 10c shows another BOL embodiment with bump material 274 narrower than conductive trace 276. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface of conductive trace 276 and asperities 280. In particular, the application of pressure causes bump material 274 to undergo a plastic deformation and cover the top surface of conductive trace 276 and asperities 280. The plastic flow of bump material 274 creates macroscopic mechanical interlocking points between the bump material and the top surface of conductive trace 276 and asperities 280. The mechanical interlock between the bump material and the top surface of conductive trace 276 and asperities 280 provides a robust connection with greater contact area between the respective surfaces, without significantly increasing the bonding force. The mechanical interlock between the bump material and the top surface of conductive trace 276 and asperities 280 also reduces lateral die shifting during subsequent manufacturing processes, such as encapsulation.

Figure 10D:
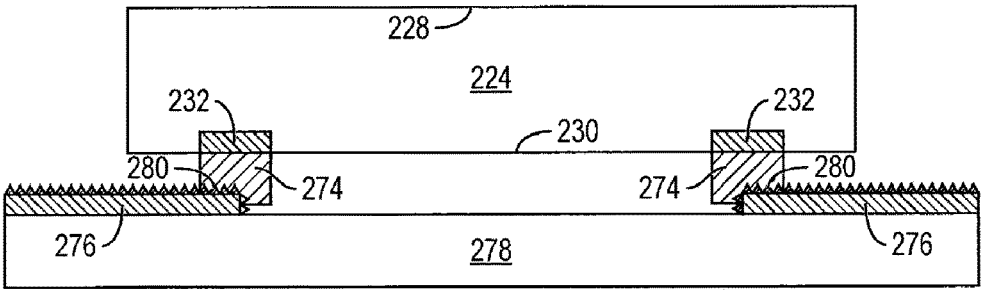

FIG. 10d shows another BOL embodiment with bump material 274 formed over an edge of conductive trace 276, i.e., part of the bump material is over the conductive trace and part of the bump material is not over the conductive trace. A pressure or force F is applied to back surface 228 of semiconductor die 224 to press bump material 274 onto conductive trace 276 and asperities 280. The force F can be applied with an elevated temperature. Due to the compliant nature of bump material 274, the bump material deforms or extrudes over the top surface and side surface of conductive trace 276 and asperities 280. In particular, the application of pressure causes bump material 274 to undergo a plastic deformation and cover the top surface and side surface of conductive trace 276 and asperities 280. The plastic flow of bump material 274 creates macroscopic mechanical interlocking between the bump material and the top surface and side surface of conductive trace 276 and asperities 280. The mechanical interlock between the bump material and the top surface and side surface of conductive trace 276 and asperities 280 provides a robust connection with greater contact area between the respective surfaces, without significantly increasing the bonding force. The mechanical interlock between the bump material and the top surface and side surface of conductive trace 276 and asperities 280 also reduces lateral die shifting during subsequent manufacturing processes, such as encapsulation.

Figure 11A:
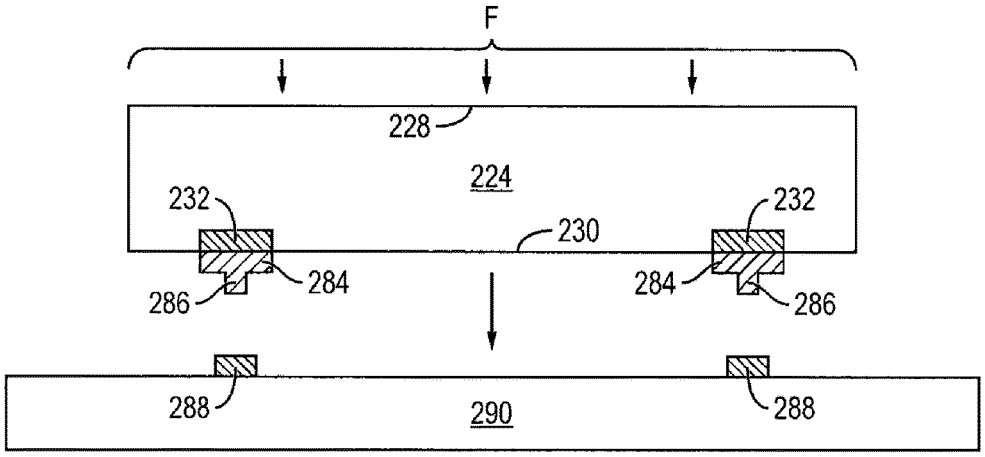
FIGS. 11a-11c illustrate stepped bump and stud bump interconnect structures bonded to the conductive traces.
Figure 11B:
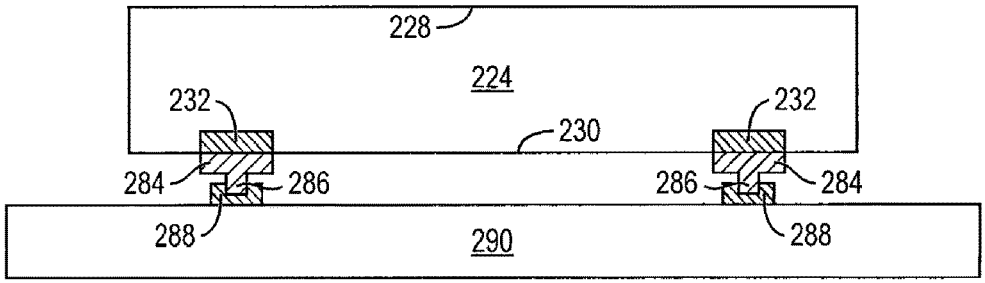
Figure 11C:
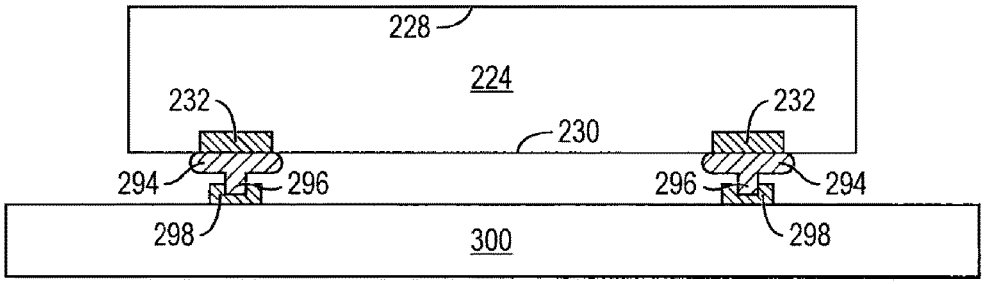

FIGS. 11a-11c show a BOL embodiment of semiconductor die 224 with bump material 284 formed over contact pads 232, similar to FIG. 7c. A tip 286 extends from the body of bump material 284 as a stepped bump with tip 286 narrower than the body of bump material 284, as shown in FIG. 11a. Semiconductor die 224 is positioned so that bump material 284 is aligned with an interconnect site on conductive trace 288 on substrate 290. More specifically, tip 286 is centered over an interconnect site on conductive trace 288. Alternatively, bump material 284 and tip 286 can be aligned with a conductive pad or other interconnect site formed on substrate 290. Bump material 284 is wider than conductive trace 288 on substrate 290.

Conductive trace 288 is generally compliant and undergoes plastic deformation greater than about 25 μm under a force equivalent to a vertical load of about 200 grams. A pressure or force F is applied to back surface 228 of semiconductor die 224 to press tip 284 onto conductive trace 288. The force F can be applied with an elevated temperature. Due to the compliant nature of conductive trace 288, the conductive trace deforms around tip 286, as shown in FIG. 11b. In particular, the application of pressure causes conductive trace 288 to undergo a plastic deformation and cover the top surface and side surface of tip 286.

FIG. 11c shows another BOL embodiment with rounded bump material 294 formed over contact pads 232. A tip 296 extends from the body of bump material 294 to form a stud bump with the tip narrower than the body of bump material 294. Semiconductor die 224 is positioned so that bump material 294 is aligned with an interconnect site on conductive trace 298 on substrate 300. More specifically, tip 296 is centered over an interconnect site on conductive trace 298. Alternatively, bump material 294 and tip 296 can be aligned with a conductive pad or other interconnect site formed on substrate 300. Bump material 294 is wider than conductive trace 298 on substrate 300.

Conductive trace 298 is generally compliant and undergoes plastic deformation greater than about 25 μm under a force equivalent to a vertical load of about 200 grams. A pressure or force F is applied to back surface 228 of semiconductor die 224 to press tip 296 onto conductive trace 298. The force F can be applied with an elevated temperature. Due to the compliant nature of conductive trace 298, the conductive trace deforms around tip 296. In particular, the application of pressure causes conductive trace 298 to undergo a plastic deformation and cover the top surface and side surface of tip 296.

The conductive traces described in FIGS. 8a-8g, 9a-9d, and 10a-10d can also be compliant material as described in FIGS. 11a-11c.

Figure 12A:
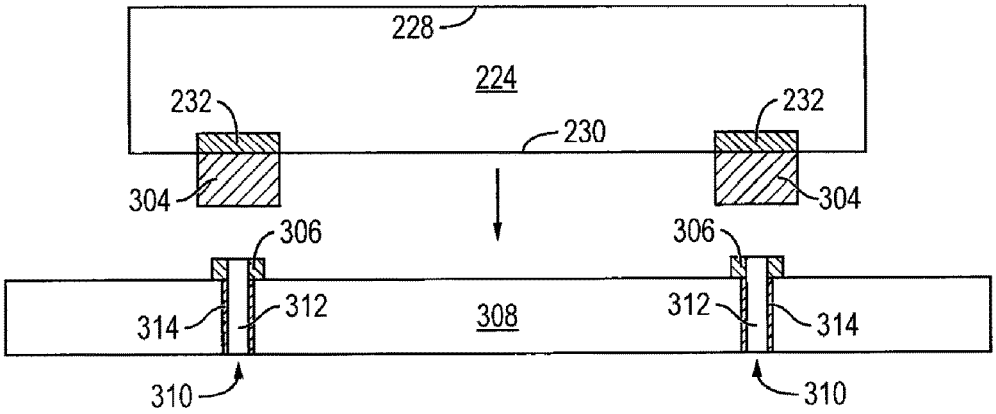
FIGS. 12a-12b illustrate conductive traces with conductive vias.
Figure 12B:
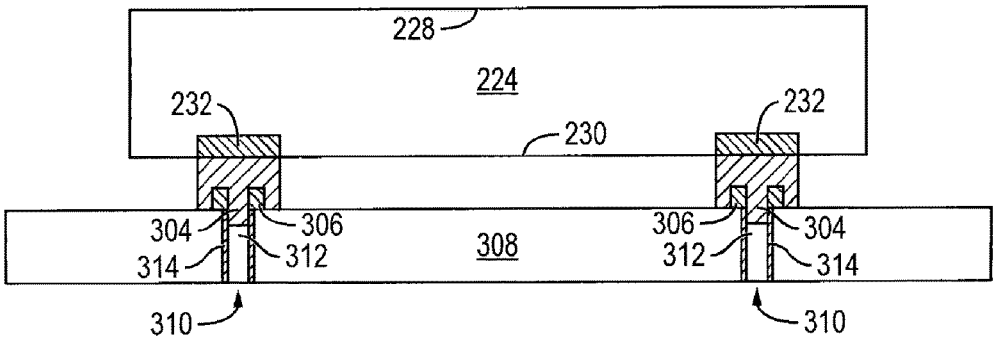

FIGS. 12a-12b show a BOL embodiment of semiconductor die 224 with bump material 304 formed over contact pads 232, similar to FIG. 7c. Bump material 304 is generally compliant and undergoes plastic deformation greater than about 25 μm under a force equivalent to a vertical load of about 200 grams. Bump material 304 is wider than conductive trace 306 on substrate 308. A conductive via 310 is formed through conductive trace 306 with an opening 312 and conductive sidewalls 314, as shown in FIG. 12a. Conductive traces 306 are applicable to the interconnect structure, as described in FIGS. 4-6.

Semiconductor die 224 is positioned so that bump material 304 is aligned with an interconnect site on conductive trace 306, see FIGS. 16a-16g. Alternatively, bump material 304 can be aligned with a conductive pad or other interconnect site formed on substrate 308. A pressure or force F is applied to back surface 228 of semiconductor die 224 to press bump material 304 onto conductive trace 306 and into opening 312 of conductive via 310. The force F can be applied with an elevated temperature. Due to the compliant nature of bump material 304, the bump material deforms or extrudes around the top surface and side surface of conductive trace 306 and into opening 312 of conductive vias 310, as shown in FIG. 12b. In particular, the application of pressure causes bump material 304 to undergo a plastic deformation and cover the top surface and side surface of conductive trace 306 and into opening 312 of conductive via 310. Bump material 304 is thus electrically connected to conductive trace 306 and conductive sidewalls 314 for z-direction vertical interconnect through substrate 308. The plastic flow of bump material 304 creates a mechanical interlock between the bump material and the top surface and side surface of conductive trace 306 and opening 312 of conductive via 310. The mechanical interlock between the bump material and the top surface and side surface of conductive trace 306 and opening 312 of conductive via 310 provides a robust connection with greater contact area between the respective surfaces, without significantly increasing the bonding force. The mechanical interlock between the bump material and the top surface and side surface of conductive trace 306 and opening 312 of conductive via 310 also reduces lateral die shifting during subsequent manufacturing processes, such as encapsulation. Since conductive via 310 is formed within the interconnect site with bump material 304, the total substrate interconnect area is reduced.

In the BOL embodiments of FIGS. 8a-8g, 9a-9d, 10a-10d, 11a-11c, and 12a-12b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 13A:
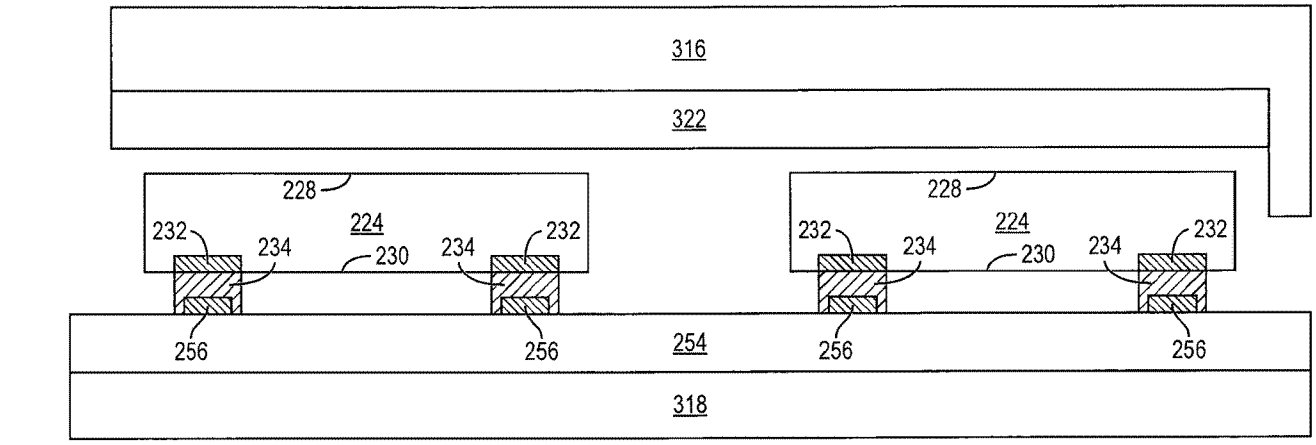
FIGS. 13a-13c illustrate mold underfill between the semiconductor die and substrate.
Figure 13B:
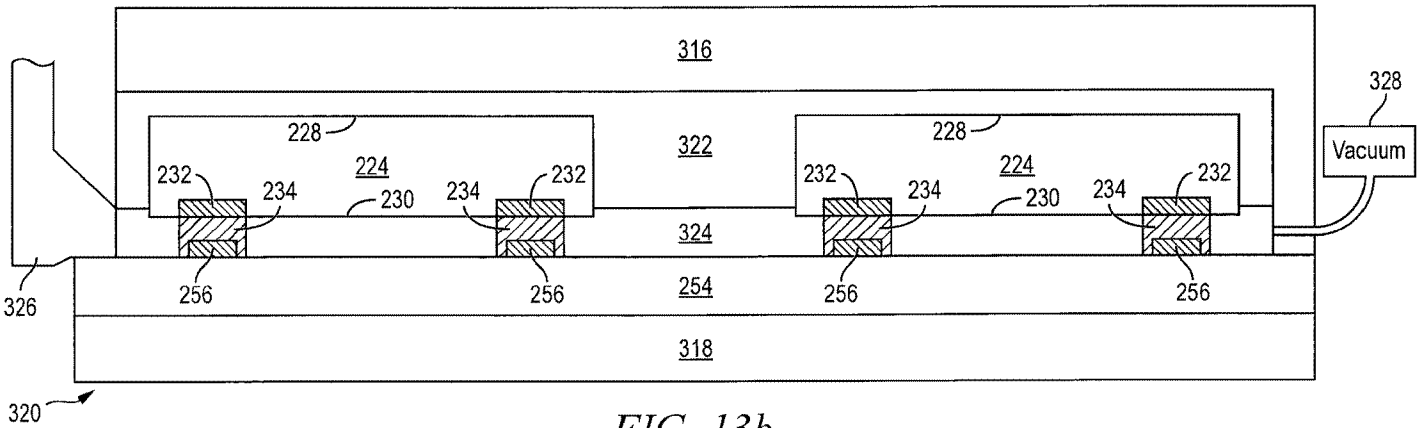
Figure 13C:
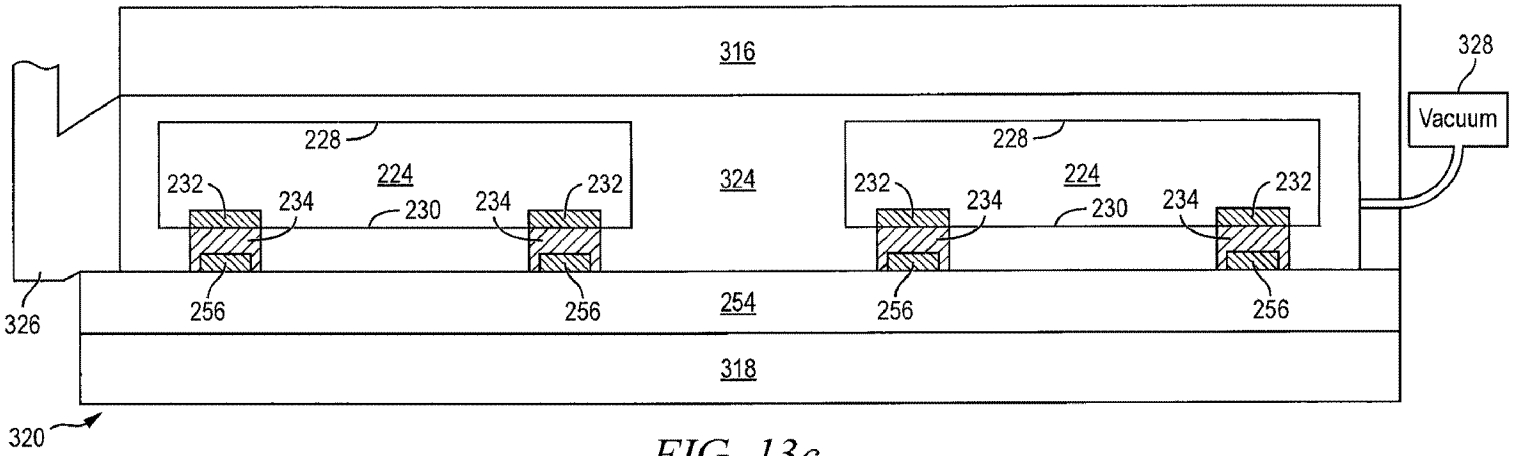

FIGS. 13a-13c show a mold underfill (MUF) process to deposit encapsulant around the bumps between the semiconductor die and substrate. FIG. 13a shows semiconductor die 224 mounted to substrate 254 using bump material 234 from FIG. 8b and placed between upper mold support 316 and lower mold support 318 of chase mold 320. The other semiconductor die and substrate combinations from FIGS. 8a-8g, 9a-9d, 10a-10d, 11a-11c, and 12a-12b can be placed between upper mold support 316 and lower mold support 318 of chase mold 320. The upper mold support 316 includes compressible releasing film 322.

In FIG. 13b, upper mold support 316 and lower mold support 318 are brought together to enclose semiconductor die 224 and substrate 254 with an open space over the substrate and between the semiconductor die and substrate. Compressible releasing film 322 conforms to back surface 228 and side surface of semiconductor die 224 to block formation of encapsulant on these surfaces. An encapsulant 324 in a liquid state is injected into one side of chase mold 320 with nozzle 326 while an optional vacuum assist 328 draws pressure from the opposite side to uniformly fill the open space over substrate 254 and the open space between semiconductor die 224 and substrate 254 with the encapsulant. Encapsulant 324 can be polymer composite material, such as epoxy resin with filler, epoxy acrylate with filler, or polymer with proper filler. Encapsulant 324 is non-conductive and environmentally protects the semiconductor device from external elements and contaminants. Compressible material 322 prevents encapsulant 324 from flowing over back surface 228 and around the side surface of semiconductor die 224. Encapsulant 324 is cured. The back surface 228 and side surface of semiconductor die 224 remain exposed from encapsulant 324.

FIG. 13c shows an embodiment of MUF and mold overfill (MOF), i.e., without compressible material 322. Semiconductor die 224 and substrate 254 are placed between upper mold support 316 and lower mold support 318 of chase mold 320. The upper mold support 316 and lower mold support 318 are brought together to enclose semiconductor die 224 and substrate 254 with an open space over the substrate, around the semiconductor die, and between the semiconductor die and substrate. Encapsulant 324 in a liquid state is injected into one side of chase mold 320 with nozzle 326 while an optional vacuum assist 328 draws pressure from the opposite side to uniformly fill the open space around semiconductor die 224 and over substrate 254 and the open space between semiconductor die 224 and substrate 254 with the encapsulant. Encapsulant 324 is cured.

Figure 14:
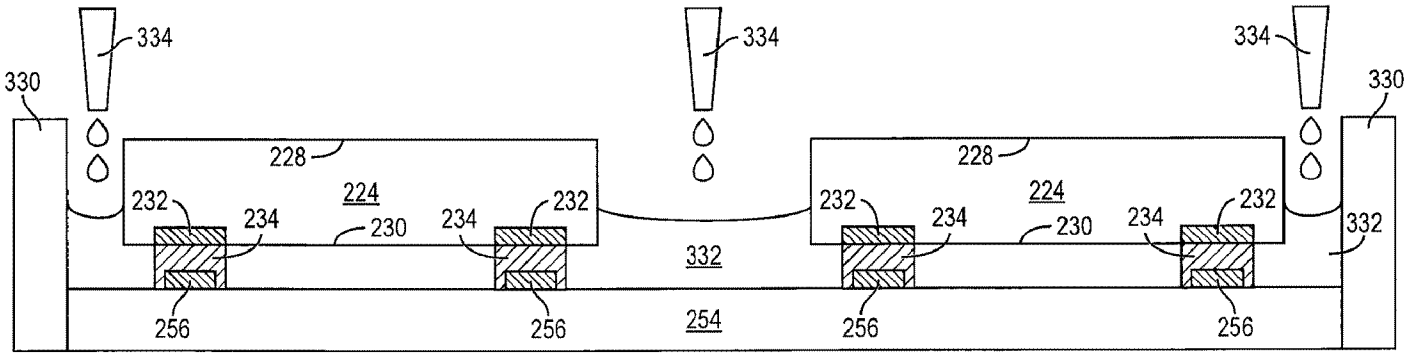
FIG. 14 illustrates another mold underfill between the semiconductor die and substrate.

FIG. 14 shows another embodiment of depositing encapsulant around semiconductor die 224 and in the gap between semiconductor die 224 and substrate 254. Semiconductor die 224 and substrate 254 are enclosed by dam 330. Encapsulant 332 is dispensed from nozzles 334 in a liquid state into dam 330 to fill the open space over substrate 254 and the open space between semiconductor die 224 and substrate 254. The volume of encapsulant 332 dispensed from nozzles 334 is controlled to fill dam 330 without covering back surface 228 or the side surface of semiconductor die 224. Encapsulant 332 is cured.

Figure 15:
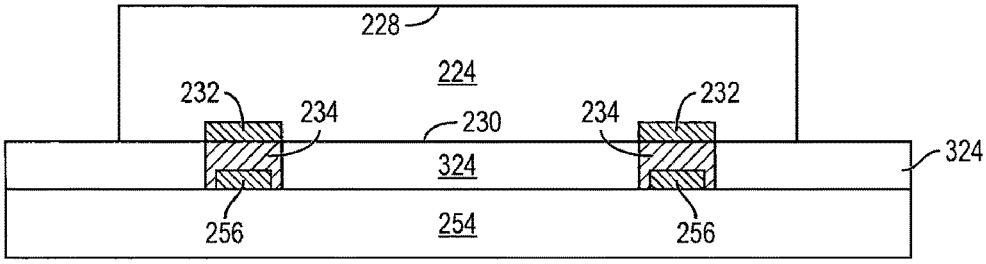
FIG. 15 illustrates the semiconductor die and substrate after mold underfill.

FIG. 15 shows semiconductor die 224 and substrate 254 after the MUF process from FIGS. 13a, 13c, and 14. Encapsulant 324 is uniformly distributed over substrate 254 and around bump material 234 between semiconductor die 224 and substrate 254.

Figure 16A:
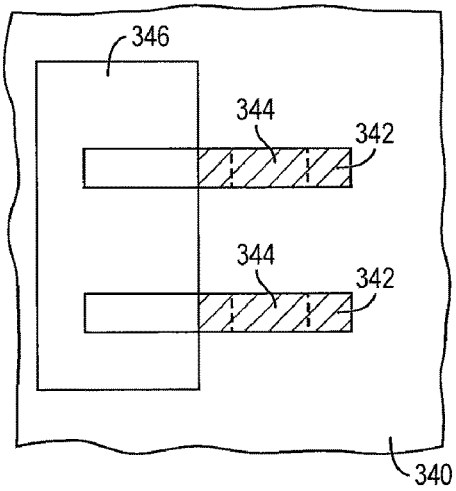
FIGS. 16a-16g illustrate various arrangements of the conductive traces with open solder registration.

FIGS. 16a-16g show top views of various conductive trace layouts on substrate or PCB 340. In FIG. 16a, conductive trace 342 is a straight conductor with integrated bump pad or interconnect site 344 formed on substrate 340. The sides of substrate bump pad 344 can be co-linear with conductive trace 342. In the prior art, a solder registration opening (SRO) is typically formed over the interconnect site to contain the bump material during reflow. The SRO increases interconnect pitch and reduces I/O count. In contrast, masking layer 346 can be formed over a portion of substrate 340; however, the masking layer is not formed around substrate bump pad 344 of conductive trace 342. That is, the portion of conductive trace 342 designed to mate with the bump material is devoid of any SRO of masking layer 346 that would have been used for bump containment during reflow.

Semiconductor die 224 is placed over substrate 340 and the bump material is aligned with substrate bump pads 344. The bump material is electrically and metallurgically connected to substrate bump pads 344 by bringing the bump material in physical contact with the bump pad and then reflowing the bump material under a reflow temperature.

Figure 16B:
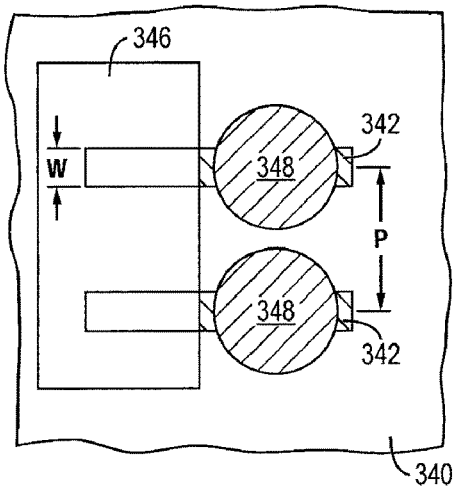

In another embodiment, an electrically conductive bump material is deposited over substrate bump pad 344 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 344 using a suitable attachment or bonding process. In one embodiment, the bump material is reflowed by heating the material above its melting point to form bump or interconnect 348, as shown in FIG. 16b. In some applications, bump 348 is reflowed a second time to improve electrical contact to substrate bump pad 344. The bump material around the narrow substrate bump pad 344 maintains die placement during reflow.

In high routing density applications, it is desirable to minimize escape pitch of conductive traces 342. The escape pitch between conductive traces 342 can be reduced by eliminating the masking layer for the purpose of reflow containment, i.e., by reflowing the bump material without a masking layer. Since no SRO is formed around die bump pad 232 or substrate bump pad 344, conductive traces 342 can be formed with a finer pitch, i.e., conductive trace 342 can be disposed closer together or to nearby structures. With no SRO around substrate bump pad 344, the pitch between conductive traces 342 is given as $P=D+PLT+W/2$, wherein D is the base diameter of bump 348, PLT is die placement tolerance, and W is the width of conductive trace 342. In one embodiment, given a bump base diameter of 100 μm, PLT of 10 μm, and trace line width of 30 μm, the minimum escape pitch of conductive trace 342 is 125 μm. The maskless bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 232 to substrate bump pad 344, the wetting and surface tension causes the bump material to maintain self-confinement and be retained within the space between die bump pad 232 and substrate bump pad 344 and portion of substrate 340 immediately adjacent to conductive trace 342 substantially within the footprint of the bump pads.

To achieve the desired self-confinement property, the bump material can be immersed in a flux solution prior to placement on die bump pad 232 or substrate bump pad 344 to selectively render the region contacted by the bump material more wettable than the surrounding area of conductive traces 342. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 340 is not needed around die bump pad 232 or substrate bump pad 344.

Figure 16C:
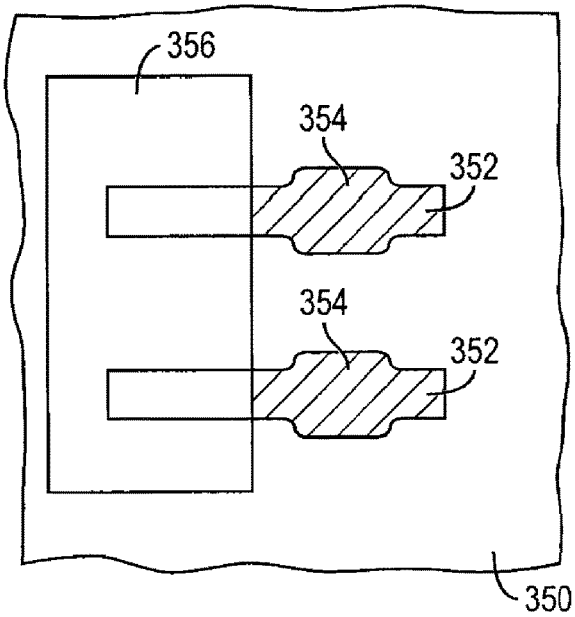

FIG. 16c shows another embodiment of parallel conductive traces 352 as a straight conductor with integrated rectangular bump pad or interconnect site 354 formed on substrate 350. In this case, substrate bump pad 354 is wider than conductive trace 352, but less than the width of the mating bump. The sides of substrate bump pad 354 can be parallel to conductive trace 352. Masking layer 356 can be formed over a portion of substrate 350; however, the masking layer is not formed around substrate bump pad 354 of conductive trace 352. That is, the portion of conductive trace 352 designed to mate with the bump material is devoid of any SRO of masking layer 356 that would have been used for bump containment during reflow.

Figure 16D:
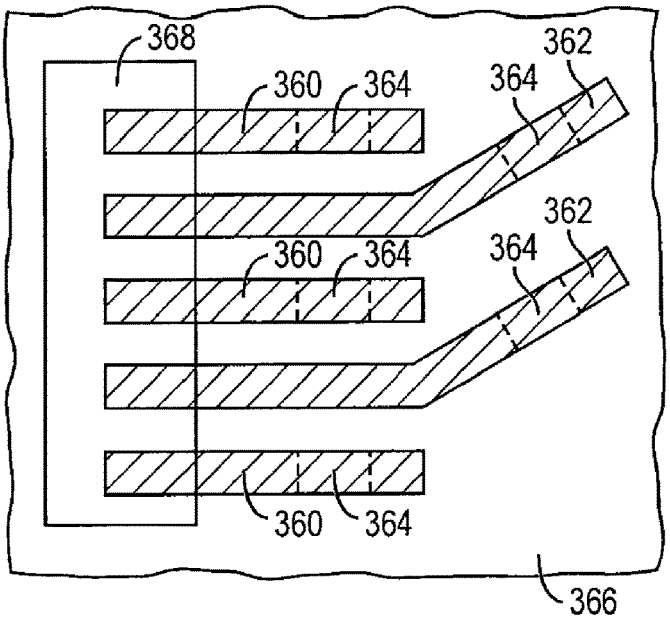

FIG. 16d shows another embodiment of conductive traces 360 and 362 arranged in an array of multiple rows with offset integrated bump pad or interconnect site 364 formed on substrate 366 for maximum interconnect escape routing density and capacity. Alternate conductive traces 360 and 362 include an elbow for routing to bump pads 364. The sides of each substrate bump pad 364 are co-linear with conductive traces 360 and 362. Masking layer 368 can be formed over a portion of substrate 366; however, masking layer 368 is not formed around substrate bump pad 364 of conductive traces 360 and 362. That is, the portion of conductive trace 360 and 362 designed to mate with the bump material is devoid of any SRO of masking layer 368 that would have been used for bump containment during reflow.

Figure 16E:
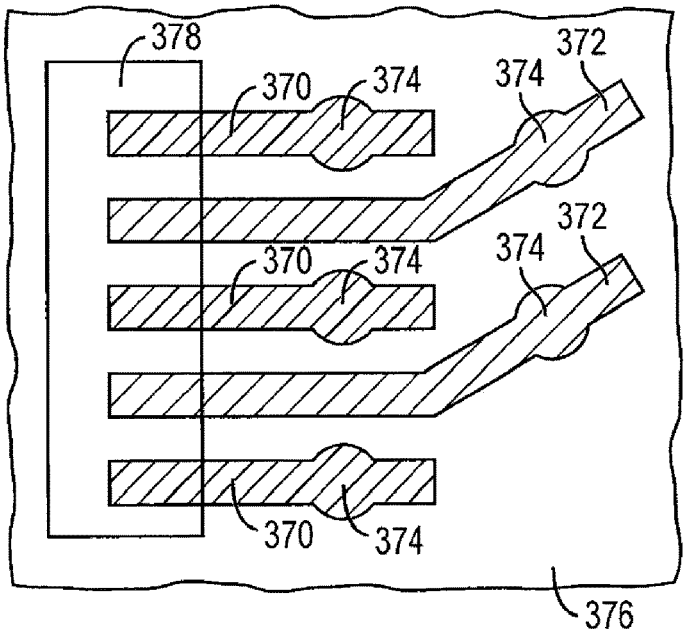

FIG. 16e shows another embodiment of conductive traces 370 and 372 arranged in an array of multiple rows with offset integrated bump pad or interconnect site 374 formed on substrate 376 for maximum interconnect escape routing density and capacity. Alternate conductive traces 370 and 372 include an elbow for routing to bump pads 374. In this case, substrate bump pad 374 is rounded and wider than conductive traces 370 and 372, but less than the width of the mating interconnect bump material. Masking layer 378 can be formed over a portion of substrate 376; however, masking layer 378 is not formed around substrate bump pad 374 of conductive traces 370 and 372. That is, the portion of conductive trace 370 and 372 designed to mate with the bump material is devoid of any SRO of masking layer 378 that would have been used for bump containment during reflow.

Figure 16F:
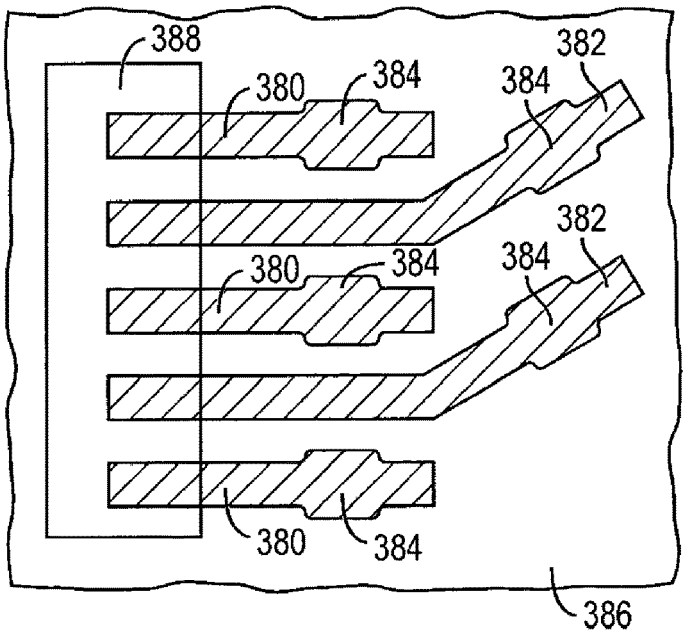

FIG. 16f shows another embodiment of conductive traces 380 and 382 arranged in an array of multiple rows with offset integrated bump pad or interconnect site 384 formed on substrate 386 for maximum interconnect escape routing density and capacity. Alternate conductive traces 380 and 382 include an elbow for routing to bump pads 384. In this case, substrate bump pad 384 is rectangular and wider than conductive traces 380 and 382, but less than the width of the mating interconnect bump material. Masking layer 388 can be formed over a portion of substrate 386; however, masking layer 388 is not formed around substrate bump pad 384 of conductive traces 380 and 382. That is, the portion of conductive trace 380 and 382 designed to mate with the bump material is devoid of any SRO of masking layer 388 that would have been used for bump containment during reflow.

As one example of the interconnect process, semiconductor die 224 is placed over substrate 366 and bump material 234 is aligned with substrate bump pads 364 from FIG. 16d. Bump material 234 is electrically and metallurgically connected to substrate bump pad 364 by pressing the bump material or by bringing the bump material in physical contact with the bump pad and then reflowing the bump material under a reflow temperature, as described for FIGS. 8a-8g, 9a-9d, 10a-10d, 11a-11c, and 12a-12b.

Figure 16G:
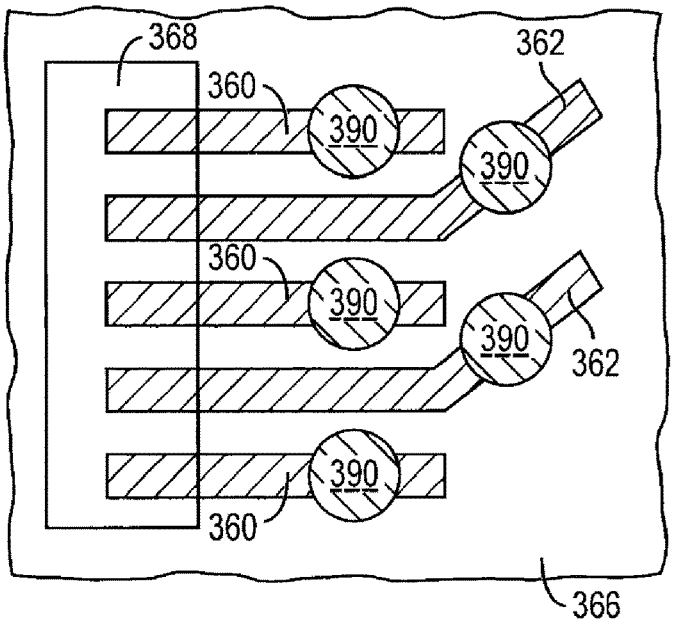

In another embodiment, an electrically conductive bump material is deposited over substrate bump pad 364 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 364 using a suitable attachment or bonding process. In one embodiment, the bump material is reflowed by heating the material above its melting point to form bump or interconnect 390, as shown in FIG. 16g. In some applications, bump 390 is reflowed a second time to improve electrical contact to substrate bump pad 364. The bump material around the narrow substrate bump pad 364 maintains die placement during reflow. Bump material 234 or bumps 390 can also be formed on substrate bump pad configurations of FIGS. 16a-16g.

In high routing density applications, it is desirable to minimize escape pitch of conductive traces 360 and 362 or other conductive trace configurations of FIGS. 16a-16g. The escape pitch between conductive traces 360 and 362 can be reduced by eliminating the masking layer for the purpose of reflow containment, i.e., by reflowing the bump material without a masking layer. Since no SRO is formed around die bump pad 232 or substrate bump pad 364, conductive traces 360 and 362 can be formed with a finer pitch, i.e., conductive traces 360 and 362 can be disposed closer together or to nearby structures. With no SRO around substrate bump pad 364, the pitch between conductive traces 360 and 362 is given as $P=D/2+PLT+W/2$, wherein D is the base diameter of bump 390, PLT is die placement tolerance, and W is the width of conductive traces 360 and 362. In one embodiment, given a bump base diameter of 100 μm, PLT of 10 μm, and trace line width of 30 μm, the minimum escape pitch of conductive traces 360 and 362 is 125 μm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 232 to substrate bump pad 364, the wetting and surface tension causes the bump material to maintain self-confinement and be retained within the space between die bump pad 232 and substrate bump pad 364 and portion of substrate 366 immediately adjacent to conductive traces 360 and 362 substantially within the footprint of the bump pads.

To achieve the desired self-confinement property, the bump material can be immersed in a flux solution prior to placement on die bump pad 232 or substrate bump pad 364 to selectively render the region contacted by the bump material more wettable than the surrounding area of conductive traces 360 and 362. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 368 is not needed around die bump pad 232 or substrate bump pad 364.

Figure 17A:
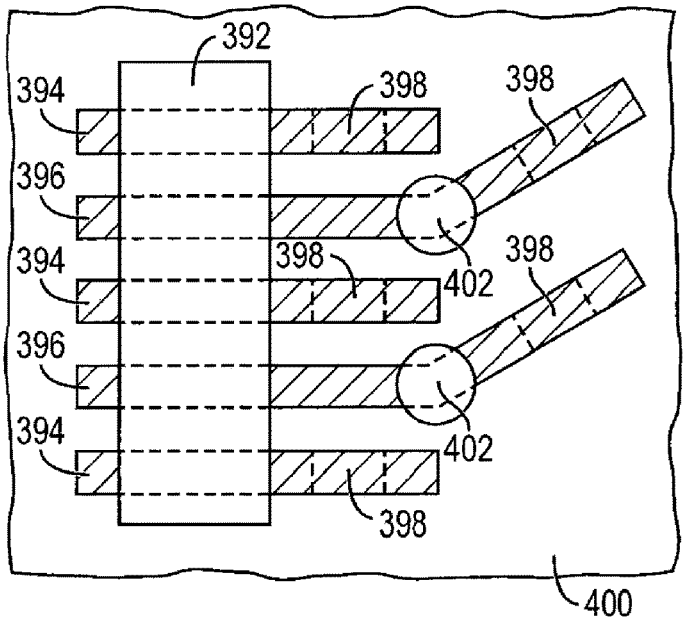
FIGS. 17a-17b illustrate the open solder registration with patches between the conductive traces.

In FIG. 17a, masking layer 392 is deposited over a portion of conductive traces 394 and 396. However, masking layer 392 is not formed over integrated bump pads 398. Consequently, there is no SRO for each bump pad 398 on substrate 400. A non-wettable masking patch 402 is formed on substrate 400 interstitially within the array of integrated bump pads 398, i.e., between adjacent bump pads. The masking patch 402 can also be formed on semiconductor die 224 interstitially within the array of die bump pads 398. More generally, the masking patch is formed in close proximity to the integrated bump pads in any arrangement to prevent runout to less wettable areas.

Semiconductor die 224 is placed over substrate 400 and the bump material is aligned with substrate bump pads 398. The bump material is electrically and metallurgically connected to substrate bump pad 398 by pressing the bump material or by bringing the bump material in physical contact with the bump pad and then reflowing the bump material under a reflow temperature, as described for FIGS. 8a-8g, 9a-9d, 10a-10d, 11a-11c, and 12a-12b.

Figure 17B:
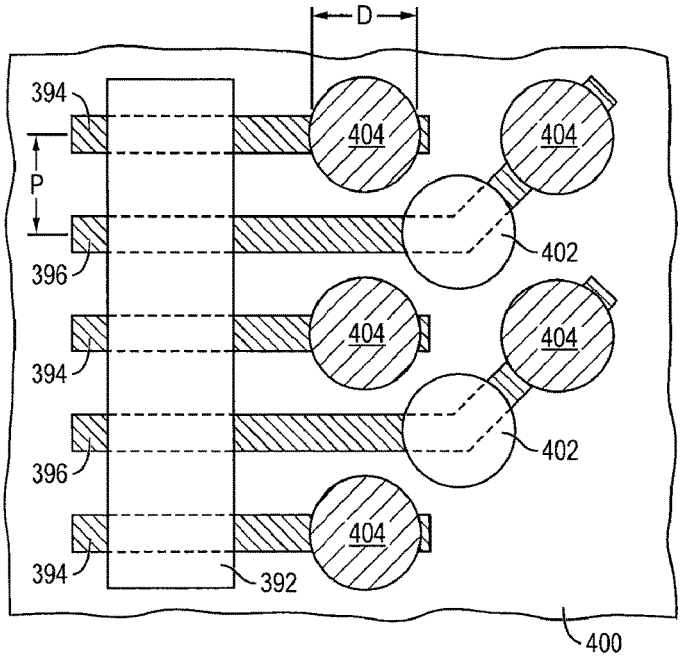

In another embodiment, an electrically conductive bump material is deposited over die integrated bump pads 398 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 398 using a suitable attachment or bonding process. In one embodiment, the bump material is reflowed by heating the material above its melting point to form spherical balls or bumps 404, as shown in FIG. 17b. In some applications, bumps 404 are reflowed a second time to improve electrical contact to integrated bump pads 398. The bumps can also be compression bonded to integrated bump pads 398. Bumps 404 represent one type of interconnect structure that can be formed over integrated bump pads 398. The interconnect structure can also use stud bump, micro bump, or other electrical interconnect.

In high routing density applications, it is desirable to minimize escape pitch. In order to reduce the pitch between conductive traces 394 and 396, the bump material is reflowed without a masking layer around integrated bump pads 398. The escape pitch between conductive traces 394 and 396 can be reduced by eliminating the masking layer and associated SROs around the integrated bump pads for the purpose of reflow containment, i.e., by reflowing the bump material without a masking layer. Masking layer 392 can be formed over a portion of conductive traces 394 and 396 and substrate 400 away from integrated bump pads 398; however, masking layer 392 is not formed around integrated bump pads 398. That is, the portion of conductive trace 394 and 396 designed to mate with the bump material is devoid of any SRO of masking layer 392 that would have been used for bump containment during reflow.

In addition, masking patch 402 is formed on substrate 400 interstitially within the array of integrated bump pads 398. Masking patch 402 is non-wettable material. Masking patch 402 can be the same material as masking layer 392 and applied during the same processing step, or a different material during a different processing step. Masking patch 402 can be formed by selective oxidation, plating, or other treatment of the portion of the trace or pad within the array of integrated bump pads 398. Masking patch 402 confines bump material flow to integrated bump pads 398 and prevents leaching of conductive bump material to adjacent structures.

When the bump material is reflowed with masking patch 402 interstitially disposed within the array of integrated bump pads 398, the wetting and surface tension causes the bump material to be confined and retained within the space between die bump pads 232 and integrated bump pads 398 and portion of substrate 400 immediately adjacent to conductive traces 394 and 396 and substantially within the footprint of the integrated bump pads 398.

To achieve the desired confinement property, the bump material can be immersed in a flux solution prior to placement on die bump pads 232 or integrated bump pads 398 to selectively render the region contacted by the bump material more wettable than the surrounding area of conductive traces 394 and 396. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 392 is not needed around die bump pads 232 or integrated bump pads 398.

Since no SRO is formed around die bump pads 232 or integrated bump pads 398, conductive traces 394 and 396 can be formed with a finer pitch, i.e., the conductive traces can be disposed closer to adjacent structures without making contact and forming electrical shorts. Assuming the same solder registration design rule, the pitch between conductive traces 394 and 396 is given as $P=(1.1\ D+W)/2$, where D is the base diameter of bump 404 and W is the width of conductive traces 394 and 396. In one embodiment, given a bump diameter of 100 μm and trace line width of 20 μm, the minimum escape pitch of conductive traces 394 and 396 is 65 μm. The bump formation eliminates the need to account for the ligament spacing of masking material between adjacent openings and minimum resolvable SRO, as found in the prior art.

Figure 18:
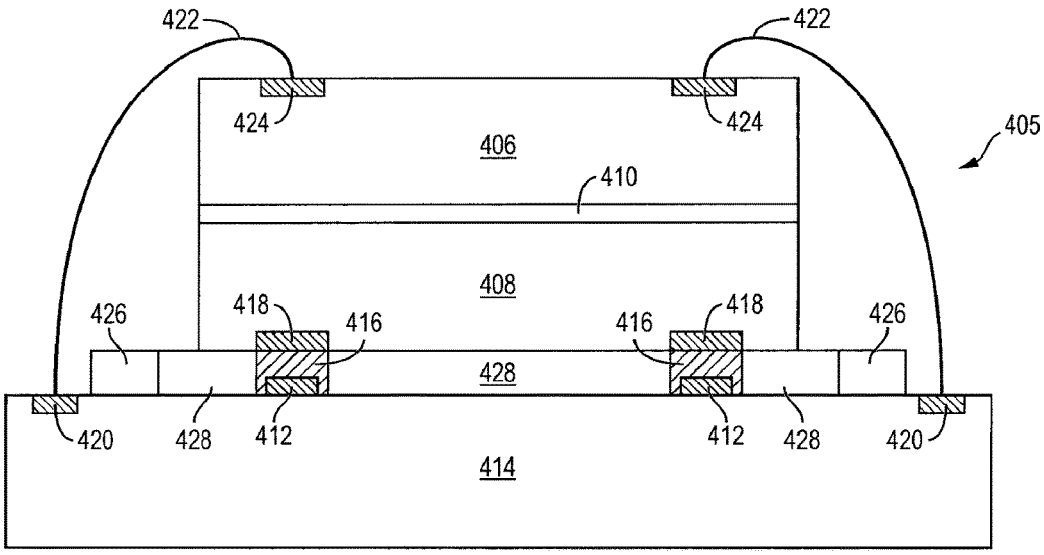
FIG. 18 illustrates a POP with masking layer dam to restrain the encapsulant during mold underfill.

FIG. 18 shows package-on-package (PoP) 405 with semiconductor die 406 stacked over semiconductor die 408 using die attach adhesive 410. Semiconductor die 406 and 408 each have an active surface containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within the active surface to implement analog circuits or digital circuits, such as DSP, ASIC, memory, or other signal processing circuit. Semiconductor die 406 and 408 can also contain IPDs, such as inductors, capacitors, and resistors, for RF signal processing.

Semiconductor die 408 is mounted to conductive traces 412 formed on substrate 414 using bump material 416 formed on contact pads 418, using any of the embodiments from FIGS. 8a-8g, 9a-9d, 10a-10d, 11a-11c, and 12a-12b. Conductive traces 412 are applicable to the interconnect structure, as described in FIGS. 4-6. Semiconductor die 406 is electrically connected to contact pads 420 formed on substrate 414 using bond wires 422. The opposite end of bond wire 422 is bonded to contact pads 424 on semiconductor die 406.

Masking layer 426 is formed over substrate 414 and opened beyond the footprint of semiconductor die 406. While masking layer 426 does not confine bump material 416 to conductive traces 412 during reflow, the open mask can operate as a dam to prevent encapsulant 428 from migrating to contact pads 420 or bond wires 422 during MUF. Encapsulant 428 is deposited between semiconductor die 408 and substrate 414, similar to FIGS. 13a-13c. Masking layer 426 blocks MUF encapsulant 428 from reaching contact pads 420 and bond wires 422, which could cause a defect. Masking layer 426 allows a larger semiconductor die to be placed on a given substrate without risk of encapsulant 428 bleeding onto contact pads 420.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a semiconductor die including a plurality of *elongated* bumps formed over a metallization on a surface of the semiconductor die*, wherein a length of the elongated bumps parallel to the surface of the semiconductor die is greater than a width of the elongated bumps parallel to the surface of the semiconductor die*;

providing a substrate;

forming a plurality of conductive traces over the substrate [and radially oriented toward a geometric center of the semiconductor die];

bonding the *elongated* bumps to *the interconnect site of* the conductive traces [so that] *with the length of* the *elongated* bumps [include a width across] *taken in a direction along* the conductive traces [less than a length along] *greater than the width of the elongated bumps taken in a direction across* the conductive traces; and depositing an encapsulant around the *elongated* bumps between the semiconductor die and substrate.

2. The method of claim 1, wherein a width of the [bump] *elongated bumps* across a surface of the metallization on the semiconductor die is 1.5 to 4.0 times the width of the [bump] *elongated bumps* across the conductive traces.

3. The method of claim 1, wherein the *elongated* bumps include a non-collapsible portion and collapsible portion.

4. The method of claim 3, wherein the non-collapsible portion of the *elongated* bumps includes gold, copper, nickel, lead solder, or lead-tin alloy and the collapsible portion of the *elongated* bumps includes tin, lead-free alloy, tin-silver alloy, tin-silver-copper alloy, tin-silver-indium alloy, eutectic solder, or tin alloys including silver, copper, or lead.

5. The method of claim 1, wherein the substrate is non-wettable along portions of the traces to limit flow of the *elongated* bumps.

6. A method of making a semiconductor device, comprising:

providing a semiconductor die *including a plurality of elongated interconnect structures on a surface of the semiconductor die, wherein a length of the elongated interconnect structures parallel to the surface of the semiconductor die is greater than a width of the elongated interconnect structures parallel to the surface of the semiconductor die*;

providing a substrate;

forming a plurality of conductive traces over the substrate [and radially oriented toward a geometric center of the semiconductor die];

[forming a plurality of] *bonding the semiconductor die to the substrate with the elongated* interconnect structures [between the semiconductor die and] *contacting* the conductive traces [so that the interconnect structures include a length along the conductive traces] *and the length of the elongated interconnect structures taken in a direction along the conductive traces greater than the width of the elongated interconnect structures taken in a direction across the conductive traces*; and depositing an encapsulant between the semiconductor die and substrate.

7. The method of claim 6, wherein a width of the *elongated* interconnect structures across a surface of the semiconductor die is 1.5 to 4.0 times a width of the *elongated* interconnect structures across the conductive traces.

8. The method of claim 6, wherein the *elongated* interconnect structures include a non-collapsible portion and collapsible portion.

9. The method of claim 8, wherein the non-collapsible portion of the *elongated* interconnect structures includes gold, copper, nickel, lead solder, or lead-tin alloy and the collapsible portion of the *elongated* interconnect structures includes tin, lead-free alloy, tin-silver alloy, tin-silver-copper alloy, tin-silver-indium alloy, eutectic solder, or tin alloys comprising copper or lead.

10. The method of claim 6, wherein the *elongated* interconnect structures cover a top surface and side surface of the conductive traces.

11. The method of claim 6, wherein the *elongated* interconnect structures diffuse strain away from the semiconductor die.

[12. The method of claim 6, wherein the interconnect structures include a width across the conductive traces less than the length along the conductive traces.]

13. A method of making a semiconductor device, comprising:

providing a semiconductor die *including a plurality of interconnect structures on a surface of the semiconductor die, wherein a length of the interconnect structures parallel to the surface of the semiconductor die is greater than a width of the interconnect structures parallel to the surface of the semiconductor die*;

providing a substrate;

forming a plurality of conductive traces over the substrate [and oriented toward a geometric center of the semiconductor die]; and

[forming a] *disposing the* plurality of interconnect structures between the semiconductor die and the conductive traces and in contact with the conductive traces*, wherein the length of the interconnect structures taken in a direction along the conductive traces is greater than the width of the interconnect structures taken in a direction across the conductive traces*.

14. The method of claim 13, further including depositing an encapsulant or underfill material between the semiconductor die and substrate using a mold underfill (MUF) process.

[15. The method of claim 13, wherein the interconnect structures include a width across the conductive traces less than a length along the conductive traces.]

16. The method of claim 13, wherein the interconnect structures include a non-collapsible portion and collapsible portion.

17. The method of claim 13, wherein the interconnect structures include a conductive pillar and bump formed over the conductive pillar.

18. The method of claim 13, wherein a width of the interconnect structures across a surface of the semiconductor die is 1.5 to 4.0 times [a] *the* width of the interconnect structures across the conductive traces.

19. A semiconductor device, comprising:

a semiconductor die *including a plurality of interconnect structures formed on a surface of the semiconductor die, wherein a length of the interconnect structures parallel to the surface of the semiconductor die is greater than a width of the interconnect structures parallel to the surface of the semiconductor die*;

a substrate including a plurality of conductive traces formed over the substrate[;

a], *wherein the* plurality of interconnect structures *is* formed between the semiconductor die and the conductive traces [and including a length along the conductive traces oriented toward a geometric center of the semiconductor die], *and the length of the interconnect structures taken in a direction along the conductive traces is greater than the width of the interconnect structures taken in a direction across the conductive traces*; and an encapsulant deposited between the semiconductor die and substrate.

[20. The semiconductor device of claim 19, wherein the interconnect structures include a width across the conductive traces less than a length along the conductive traces.]

21. The semiconductor device of claim 19, wherein the interconnect structures include a non-collapsible portion and collapsible portion.

22. The semiconductor device of claim 21, wherein the non-collapsible portion of the interconnect structures includes gold, copper, nickel, lead solder, or lead-tin alloy and the collapsible portion of the interconnect structures includes tin, lead-free alloy, tin-silver alloy, tin-silver-copper alloy, tin-silver-indium alloy, eutectic solder, or tin alloys comprising copper or lead.

23. The semiconductor device of claim 19, wherein the interconnect structures include a conductive pillar and bump disposed over the conductive pillar.

24. The semiconductor device of claim 19, wherein a width of the interconnect structures across a surface of the semiconductor die is 1.5 to 4.0 times [a] *the* width of the interconnect structures across the conductive traces.

25. A semiconductor device, comprising:

a substrate;

a semiconductor component disposed over the substrate; [and]

a conductive trace formed over the substrate [and including an orientation towards a thermally neutral point of the semiconductor component]; *and*

*an elongated interconnect structure formed between the semiconductor component and an interconnect site of the conductive trace, wherein a length of the elongated interconnect structure taken in a direction along the interconnect site is greater than a width of the elongated interconnect structure taken in a direction across the interconnect site, and the width of the elongated interconnect structure is tapered along the length of the elongated interconnect structure to be wider proximate to the semiconductor component and narrower proximate to the interconnect site*.

[26. The semiconductor device of claim 25, wherein the orientation of the conductive trace deviates less than forty five degrees from being directly aligned towards the thermally neutral point of the semiconductor component.]

[27. The semiconductor device of claim 25, further including an interconnect structure connected between the conductive trace and the semiconductor component.]

28. The semiconductor device of claim [27] *25*, further including a portion of the *elongated* interconnect structure [collapsed around] *covers a top surface and side surface of* the conductive trace.

[29. The semiconductor device of claim 27, wherein the interconnect structure further includes a length along the conductive trace and a width across the conductive trace less than the length along the conductive trace.]

30. The semiconductor device of claim [27] *25*, wherein a width of the *elongated* interconnect structure across a surface of the semiconductor component is 1.5 to 4.0 times [a] *the* width of the *elongated* interconnect structure across the conductive trace.

*31. The semiconductor device of claim 1, wherein the width of the elongated bumps is tapered along the length of the elongated bumps to be wider proximate to the semiconductor die and narrower proximate to the conductive traces.*

*32. The semiconductor device of claim 6, wherein the width of the elongated interconnect structures is tapered along the length of the elongated interconnect structures to be wider proximate to the semiconductor die and narrower proximate to the conductive traces.*

*33. The semiconductor device of claim 13, wherein the width of the interconnect structures is tapered along the length of the interconnect structures to be wider proximate to the semiconductor die and narrower proximate to the conductive traces.*

*34. The semiconductor device of claim 19, wherein the width of the interconnect structures is tapered along the length of the interconnect structures to be wider proximate to the semiconductor die and narrower proximate to the conductive traces.*

* * * * *